United States Patent [19]
Johannsen

[11] Patent Number: 5,841,674
[45] Date of Patent: Nov. 24, 1998

[54] CIRCUIT DESIGN METHODS AND TOOLS

[75] Inventor: David L. Johannsen, San Gabriel, Calif.

[73] Assignee: Viewlogic Systems, Inc., Marlboro, Mass.

[21] Appl. No.: 845,813

[22] Filed: Apr. 29, 1997

Related U.S. Application Data

[62] Division of Ser. No. 572,520, Dec. 14, 1995.

[51] Int. Cl.$^6$ .............................. G06F 17/50; G06F 7/52
[52] U.S. Cl. ...................... 364/489; 364/490; 364/491; 364/754.01; 364/760.03
[58] Field of Search ................................... 364/488–491, 364/754.01–760.05

[56] References Cited

U.S. PATENT DOCUMENTS

| | | | |
|---|---|---|---|
| 3,968,478 | 7/1976 | Mensch, Jr. | 340/172.5 |
| 4,093,990 | 6/1978 | Koller et al. | 364/520 |
| 4,377,849 | 3/1983 | Finger et al. | 364/491 |
| 4,652,992 | 3/1987 | Mensch, Jr. | 364/200 |
| 4,701,860 | 10/1987 | Mader | 364/490 |
| 4,827,428 | 5/1989 | Dunlop et al. | 364/491 |
| 4,829,446 | 5/1989 | Draney | 364/488 |
| 4,868,778 | 9/1989 | Disbrow | 364/757 |
| 5,068,823 | 11/1991 | Robinson | 395/500 |
| 5,119,314 | 6/1992 | Hotta et al. | 364/491 |
| 5,175,693 | 12/1992 | Kurosawa et al. | 364/491 |
| 5,282,140 | 1/1994 | Tazawa et al. | 364/468 |
| 5,297,053 | 3/1994 | Pease et al. | 364/474.24 |
| 5,319,570 | 6/1994 | Davidson et al. | 364/488 |
| 5,412,591 | 5/1995 | Bapst | 364/757 |
| 5,541,849 | 7/1996 | Rostoker et al. | 364/489 |
| 5,586,046 | 12/1996 | Feldbaumer et al. | 364/490 |

OTHER PUBLICATIONS

Breching, George E., et al. "Automatic Circuit Generation Process and Apparatus", Nov. 4, 1975, Defensive Publication, United States Patent and Trademark Office.

Colton, W. F., et al., "Process for Making LSI Chips Having Both Rules Driven and Free Form Design", Sep. 2, 1975, Defensive Publication, United States Patent and Trademark Office.

Johannsen, David Lawrence, "Silicon Compilation", 1981, Technical Report #4530, Department of Computer Science, California Institute of Technology, Pasadena, California.

Ghosh et al., "TWTXBB: a low latency, high throughput multiplier architecture using a new p/spl rarr/2 compressor", ACM, Proceedings of the 7th International Conference on VLSI Design, 5 Jan. 1994, pp. 77–82.

Mou et al., "'Overturned–stairs' adder trees and multiplier design", IEEE Transactions on Computers, vol. 41, No. 8, Aug. 1992, pp. 940–948.

Paschalis et al., "Efficient modular design of TSC checkers for m–out–of–2m codes", IEEE, IEEE Transactions on Computers, vol. 37, No. 3, Mar. 1988, pp. 301–309.

Fadavi–Ardekani, "M*N Booth encoded multiplier generator using optimized Wallace trees", IEEE Comput. Soc. Press, IEEE 1992 International Conference on Computer Design, 11 Oct. 1992, pp. 114–117.

Oklobdzija et al., "Multiplier design utilizing improved column compression tree and optimized final adder in CMOS technology", IEEE, Proceedings of the 1993 International Symposium on VLSI Technology, Systems, and Application, 12 May 1993, pp. 209–212.

*Primary Examiner*—Kevin J. Teska
*Assistant Examiner*—Phallaka Kik
*Attorney, Agent, or Firm*—D'Alessandro & Ritchie

[57] ABSTRACT

A circuit design tool which includes an architecture for a multiplier which is faster and more compact than known multipliers through the use of Wallace trees, the elimination of Dadda nodes along the critical paths, the placement of half-adders at an initial pat of the Wallace tree, the replacement of low-order terminating adders with ripple-carry adders, and the replacement of high-order terminating adders with carry-select adders.

5 Claims, 22 Drawing Sheets

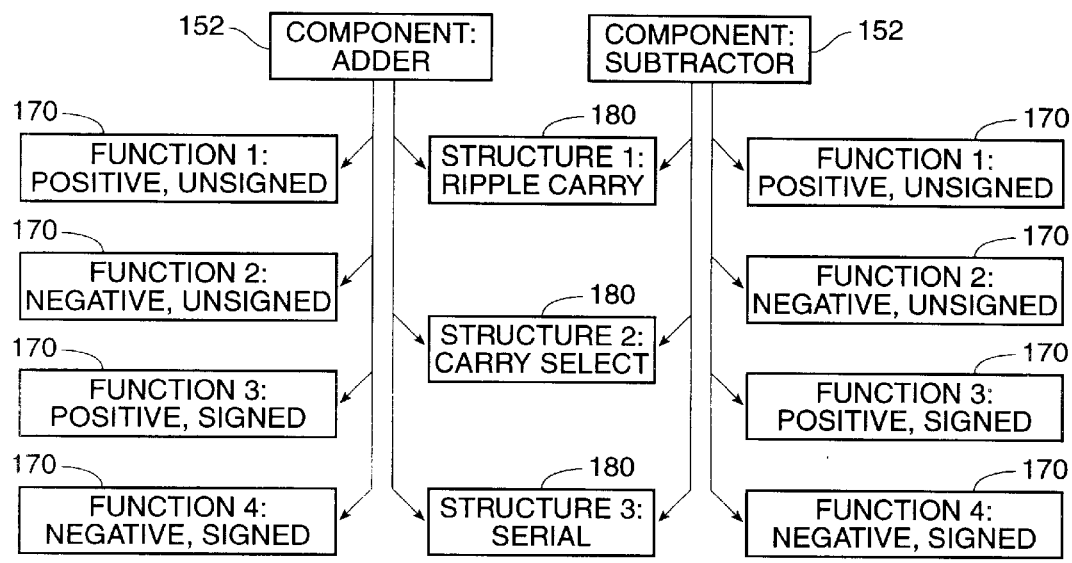

FIG. 4

$$503 \begin{cases} F1: & C = \overset{501}{\textcircled{A}} \overset{501}{\textcircled{B}} \\ & \textcircled{O} = A \oplus B \\ & \phantom{O = A \oplus B} {\scriptstyle 502} \end{cases}$$

F1: $C = \overline{A}\,\overline{B}$
$O = A \oplus B$ $$503 \begin{cases} F2: & C = A\,B + A\,I + B\,I \\ & O = A \oplus B \oplus I \end{cases}$$

F2: $C = \overline{A}\,\overline{B} + \overline{A}\,I + \overline{B}\,I$
$O = A \oplus B \oplus I$ $$503 \begin{cases} F3: & O = A \oplus B \oplus I \end{cases}$$

F3: $O = A \oplus B \overline{\oplus} I$ (a) POSITIVE, UNSIGNED ADDER (b) NEGATIVE, UNSIGNED ADDER F1: $C = A\,\overline{B}$
$O = A \oplus B$ F1: $C = \overline{A}\,B$
$O = A \oplus B$ F2: $C = \overline{A}\,B + \overline{A}\,I + B\,I$
$O = A \oplus B \oplus I$ F2: $C = A\,\overline{B} + A\,I + \overline{B}\,I$
$O = A \oplus B \oplus I$ F3: $O = A \oplus B \oplus I$ F3: $O = A \oplus B \overline{\oplus} I$ (c) POSITIVE, UNSIGNED SUBTRACTOR (d) NEGATIVE, UNSIGNED SUBTRACTOR

FIG. 5

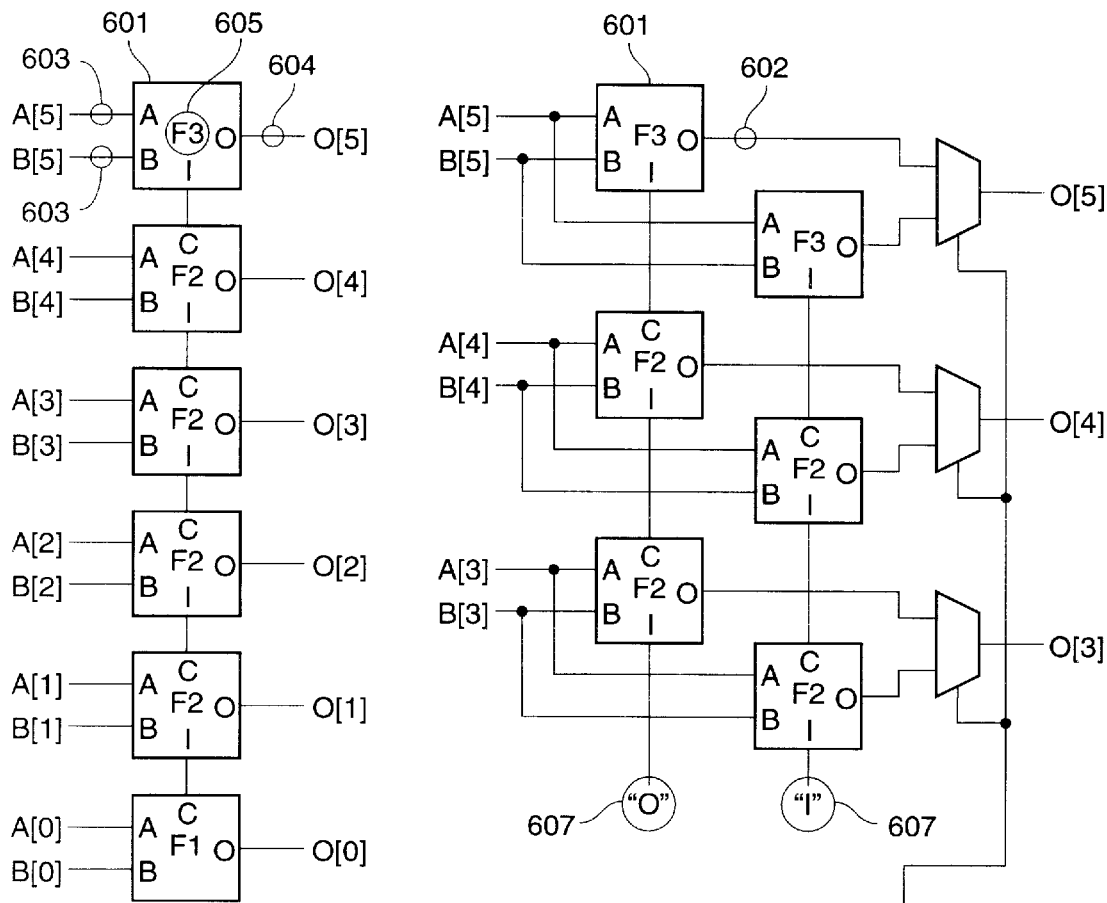
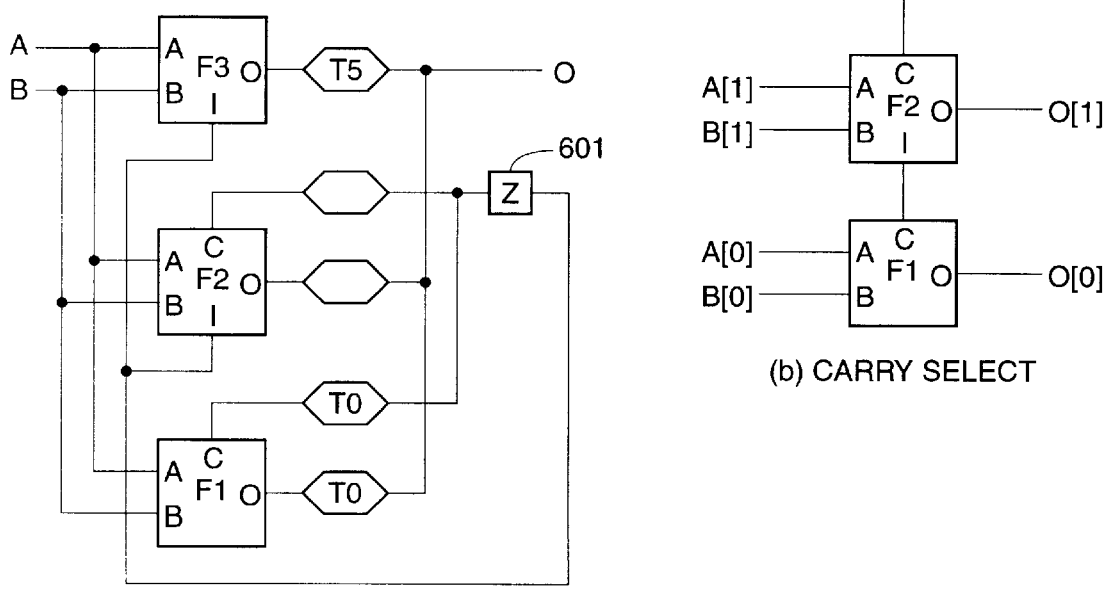
(a) RIPPLE CARRY
(b) CARRY SELECT
(c) SERIAL
FIG. 6

| INPUT BITS | | | | OUTPUT BITS | | | | |
|---|---|---|---|---|---|---|---|---|
| 501 | 501 | 501 | 501 | 502 | 502 | 502 | 502 | |
| $A_3$ | $A_2$ | $A_1$ | $A_0$ | $B_3$ | $B_2$ | $B_1$ | $B_0$ | |
| 0 | 0 | 0 | 0 | 0 | 0 | 0 | 1 | } 1100 |
| 0 | 0 | 0 | 1 | 0 | 0 | 1 | 0 | } 1100 |
| 0 | 0 | 1 | 0 | 0 | 0 | 1 | 1 | } 1100 |
| 0 | 0 | 1 | 1 | 0 | 1 | 0 | 0 | } 1100 |
| 0 | 1 | 0 | 0 | 0 | 1 | 0 | 1 | |
| 0 | 1 | 0 | 1 | 0 | 1 | 1 | 0 | |
| 0 | 1 | 1 | 0 | 0 | 1 | 1 | 1 | |
| 0 | 1 | 1 | 1 | 1 | 0 | 0 | 0 | |
| 1 | 0 | 0 | 0 | 1 | 0 | 0 | 1 | |
| 1 | 0 | 0 | 1 | 1 | 0 | 1 | 0 | |
| 1 | 0 | 1 | 0 | 1 | 0 | 1 | 1 | |
| 1 | 0 | 1 | 1 | 1 | 1 | 0 | 0 | |
| 1 | 1 | 0 | 0 | 1 | 1 | 0 | 1 | |
| 1 | 1 | 0 | 1 | 1 | 1 | 1 | 0 | |
| 1 | 1 | 1 | 0 | 1 | 1 | 1 | 1 | |
| 1 | 1 | 1 | 1 | 0 | 0 | 0 | 0 | |

(Input row 1: each 0 labeled 1110; Output row 1: first three 0s and the 1 labeled 1110)

*FIG. 11*

CIRCUIT DESIGN METHODS AND TOOLS

CROSS-REFERENCE TO RELATED APPLICATION

This is a divisional of patent application Ser. No. 08/572,520, filed Dec. 14, 1995.

BACKGROUND OF THE INVENTION

1. Field of the Invention

This invention relates to circuit design methods and tools.

2. Description of Related Art

As it has become possible to integrate more circuit elements onto a single chip, it has also become desirable to design circuits, particularly digital circuits, with more elements. Circuits with more elements are often more complex and perform more functions than earlier circuits, or perform the same functions as earlier circuits but with more data at once. As circuits have become more complex, quickly designing circuits which are simultaneously fast and compact has become more difficult. Accordingly, it is now common to employ automated circuit design tools which allow the tool user to specify a circuit design and which compile that circuit design into a netlist for fabrication. Many automated circuit design tools further attempt to optimize the netlist for speed, area, or other design parameters.

One problem which has arisen in the art is that, due to the large number of circuit elements, the number of possible optimizations rises exponentially with the number of gates in the circuit. Required computation time and storage therefore also rise exponentially, causing it to be difficult to automatically prepare a circuit which is larger than about 5,000 gates (although the threshold at which difficulty becomes insurmountable varies significantly with the complexity of the circuit). Moreover, automated design runs for circuits of this level of complexity can occupy between about six to nine hours of computation on an individual workstation.

However, tool users often wish to design circuits which have 100,000 gates or more, using automated design tools. One known method for designing such circuits is to partition the circuit into segments which are each within the size limit of the design tool, to use the design tool to optimize each segment, and to combine the segments together into a consolidated circuit. While this method achieves the goal of designing relatively complex or large circuits, it has serious drawbacks. First, the tool user is forced to partition the circuit into segments before knowing how that partition will affect the optimization of the circuit. Second, the tool user is forced to optimize each segment individually using the design tool, rather than being able to optimize across segments. The tool user may be required to engage in painstaking reoptimization of each segment of the circuit in an effort to obtain the preferred tradeoff of speed and area for the entire circuit.

Accordingly, it would be advantageous to provide an improved circuit design tool which allows the tool user to quickly design and automatically optimize complex or large circuits.

The following patents and publications may be pertinent:

U.S. Defensive Publication T 938,005, published Sep. 2, 1975, titled "Process for Making LSI Chips Having Both Rules Driven and Free Form Design";

U.S. Defensive Publication T 940,020, published Nov. 4, 1975, titled "Automatic Circuit Generation Process and Apparatus";

U.S. Pat. No. 3,968,478, issued Jul. 6, 1976, in the name of inventor William D. Mensch, Jr., titled "Chip Topography for MOS Interface Circuit";

U.S. Pat. No. 4,093,990, issued Jun. 6, 1978, in the name of inventors Konrad Koller, et al., titled "Method for the Production of Mask Patterns for Integrated Semiconductor Circuits";

U.S. Pat. No. 4,377,849, issued Mar. 22, 1983, in the name of inventors William C. Finger, et al., titled "Macro Assembler Process for Automated Circuit Design";

U.S. Pat. No. 4,652,992, issued Mar. 24, 1987, in the name of inventor William D. Mensch, Jr., titled "Topography of Integrated Circuit CMOS Microprocessor Chip";

U.S. Pat. No. 4,701,860, issued Oct. 20, 1987, in the name of inventor James M. Mader, titled "Integrated Circuit Architecture Formed of Parametric Macro-Cells";

U.S. Pat. No. 4,827,428, issued May 2, 1989, in the name of inventors Alfred E. Dunlop, et al., titled "Transistor Sizing System for Integrated Circuits";

U.S. Pat. No. 4,829,446, issued May 9, 1989, in the name of inventor Marlow R. Draney, titled "Method and Apparatus for Recording and Rearranging Representations of Objects in a Model of a Group of Objects Located Using a Co-Ordinate System";

U.S. Pat. No. 5,068,823, issued Nov. 26, 1991, in the name of inventor Jeffrey I. Robinson, titled "Programmable Integrated Circuit Using Topological and Parametric Data to Selectively Connect and Configure Different High Level Functional Blocks Thereof";

U.S. Pat. No. 5,119,314, issued Jun. 2, 1992, in the name of inventors Takashi Hotta, et al., titled "Semiconductor Integrated Circuit Device";

U.S. Pat. No. 5,175,693, issued Dec. 29, 1992, in the name of inventors Sachiko Kurosawa, et al., titled "Method of Designing Semiconductor Integrated Circuit Device";

U.S. Pat. No. 5,282,140, issued Jan. 25, 1994, in the name of inventors Satoshi Tazawa, et al., titled "Particle Flux Shadowing for Three-Dimensional Topography Simulation";

U.S. Pat. No. 5,297,053, issued Mar. 22, 1994, in the name of inventors Mark D. Pease, et al., titled "Method and Apparatus for Deferred Package Assignment for Components of an Electronic Circuit for a Printed Circuit Board"; and U.S. Pat. No. 5,319,570, issued Jun. 7, 1994, in the name of inventors Joanne M. Davidson, et al., titled "Control of Large Scale Topography on Silicon Wafers".

The pertinence of the related art will also be apparent to those skilled in the art after perusal of this application.

SUMMARY OF THE INVENTION

The invention provides a circuit design tool, to be used by a circuit designer (the "tool user") in designing circuits and their components, which receives a high-level circuit design and generates a netlist of gates for fabrication. The circuit design tool uses a component generator engine for generating variations of each component of the consolidated circuit and for providing substantially exact measurements (such as for speed and area) for those components, and an optimizer for selecting which variation for each component is best to globally optimize the consolidated circuit.

The circuit design tool also includes several other advances over traditional circuit design. First, the circuit design tool separates structural and functional aspects of components. This allows the tool user to specify the desired functional behavior of the component, leaving the actual gate-level design of the component to the design tool. For example, the tool user may specify for an adder component that it is a 16-bit adder, leaving the choice of whether to build a carry-lookahead adder or a carry-save adder to the design tool. An aspect of this advance is that when the tool user has no preference for structural aspects of the component, the design tool may select a structure for the component which is in accord with the tool user's expressed goals (for example, area, power, or speed).

Second, the circuit design tool translates a model of the desired logical behavior and structural description of a component into a regularized set of logic equations to achieve that desired behavior. For example, the tool user may specify for a component that it is a 16-bit gray code counter, leaving the choice of the specific logic circuitry for each bit to the design tool. An aspect of this advance is that the circuit design tool will attempt to select a structure which is as regularized as possible. This aspect of the invention also includes a library of logic equations for components which have been selected using the circuit design tool.

Third, the circuit design tool verifies equivalence between pairs of structures for components. For example, a first structure may have a ripple-carry architecture while a second structure may have a serial carry-chain architecture. An aspect of this advance is that the circuit design tool can verify that components in a library which are intended to be structurally equivalent are in fact structurally equivalent. This aspect of the invention also includes a library of structures for components which have been selected using the circuit design tool.

Fourth, the circuit design tool includes a method for bit-reversing the signal flow in a component. In many components the bit-direction (most significant to least significant, or vice versa) is critical to the decision of whether to use a serial or parallel architecture for the component. The capability of bit-reversing signal flow in a component allows the tool user to leave the choice of bit-direction and whether to use a serial or parallel architecture to the circuit design tool.

Fifth, the circuit design tool includes a method for performing arithmetic operations backwards from a natural order, i.e., most significant bit first versus least significant bit first. This is similar to the fourth aspect of the invention, but the work of bit-reversing the component is performed ahead of time for certain arithmetic components. The capability of performing arithmetic operations in backwards order allows the tool user to leave the choice of bit-direction for arithmetic operations to the design tool.

Sixth, the circuit design tool includes an architecture for a multiplier, including both logic equations and structural description, which is faster and more compact than known multipliers.

Seventh, the circuit design tool includes a method of translating a logic equation into a netlist of connected logic gates. The method includes translation of a set of logic gate specifications into a set of permuted truth tables for those logic gates, then to a tree form, then to a sequence of tests for recognizing a function performed by one of those logic gates in a specification of the logic equation. In a preferred embodiment, the method can be used to generate a database of functional elements for use by the circuit design tool. This aspect of the invention also includes the database of functional elements which have been selected using the method.

Each of these aspects of the invention is integrated together in a circuit design tool, and methods for using the circuit design tool, which provides extremely flexible design of individual components in a consolidated circuit, to achieve expressed goals of the tool user.

BRIEF DESCRIPTION OF THE DRAWINGS

FIG. 4 shows example relationships between components, functional descriptions for those components, and structural descriptions for those components.

FIG. 5 (panels A, B, C, and D) shows example functional descriptions.

FIG. 6 (panels A, B, and C) shows example structural descriptions.

FIG. 11 shows an example set of test vectors 1100 from which the logic equations are determined.

DESCRIPTION OF THE PREFERRED EMBODIMENT

In the following description, a preferred embodiment of the invention is described with regard to preferred process steps, data structures, and related techniques. However, those skilled in the art would recognize, after perusal of this application, that embodiments of the invention may be implemented using a general purpose computer operating under program control, and that modification of a general purpose computer to implement the process steps and data structures described herein would not require either invention or undue experimentation.

The system described herein has been built to operate on a hardware computing platform, as described herein, and successfully operates to construct optimized netlists having over 10,000 macros in less than about 5 minutes. This is vastly superior to the prior art, which typically is unable to construct optimized netlists having over 5,000 macros, and typically take about 5–6 hours on a similar hardware computing platform.

Figure 1:
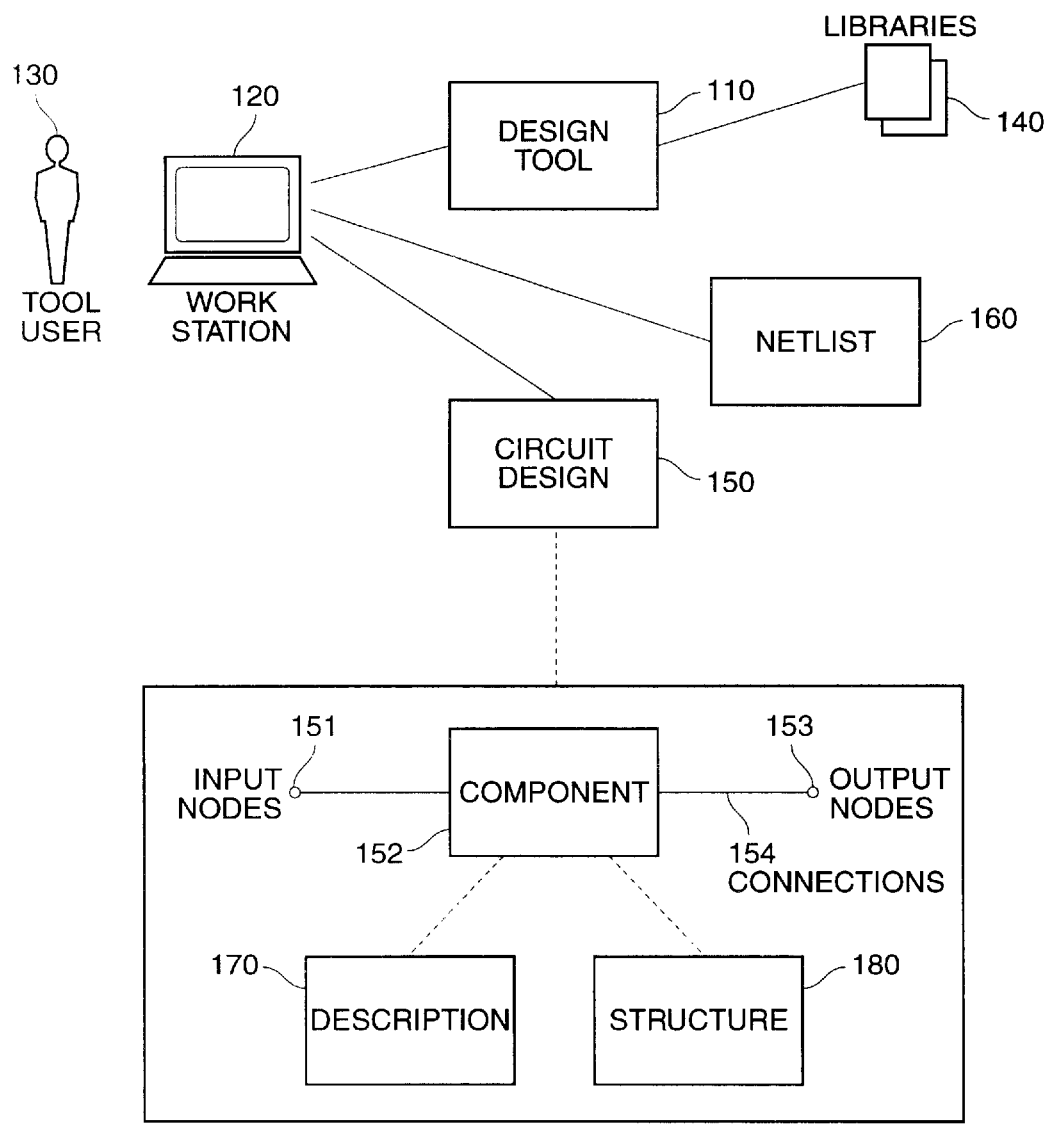
FIG. 1 shows a block diagram for a system for circuit design.

FIG. 1 shows a block diagram for a system for circuit design.

In a system 100 for circuit design, a circuit design tool 110 is coupled to a workstation 120 for use by a tool user 130.

In a preferred embodiment, the circuit design tool 110 comprises a software application program for execution by one or more processors at the workstation 120, under direction of an operating system program at the workstation 120. The circuit design tool 110 also comprises one or more libraries 140, as further described herein.

In a preferred embodiment, the workstation 120 comprises a processor having program and data memory, mass storage, a keyboard and pointing device or other input devices, and a display or other output devices. The processor operates under control of operating system and applications software stored using the mass storage and copied to the program memory for normal operation, operates upon library data structures stored using the mass storage and copied to the data memory for use, and operates upon temporary and output data structures stored in the data memory and copied to the mass storage or displayed for output as appropriate.

In a first preferred embodiment, the workstation 120 comprises an Intel "Pentium 133 MHz" processor having 16 megabytes of RAM and 1,000 or more megabytes of magnetic disk mass storage, operating under control of the Microsoft Windows NT 3.51 operating system and under control of applications software which performs the steps of the methods described herein.

In a second preferred embodiment, the workstation 120 comprises a Sun Microsystems "SPARCstation 20" workstation, having 32 megabytes of RAM and 1,000 or more megabytes of magnetic disk mass storage, operating under control of the SunOS 4.1.3 operating system or the Solaris 2.6 operating system and under control of applications software which performs the steps of the methods described herein.

In a preferred embodiment, the tool user 130 preferably comprises a person or a team of people, but could possibly comprise a computer program or one or more computer programs operating under control of one or more people.

In a method of circuit design to be described, the tool user 130 first constructs a high-level circuit design 150. The high-level circuit design 150 generally includes the desired outputs of the circuit, the required inputs for the circuit, and the preferred technique used by the circuit for determining its outputs in response to its inputs. The high-level circuit design 150 may comprise a textual description of a circuit, such as one written in the "Verilog" circuit description language, the "VHDL" circuit description language, or some other description language. The high-level circuit design 150 may comprise a graphical description of a circuit, such as a schematic diagram, a register transfer level diagram, or some other graphical description. The high-level circuit design 150 may comprise a combination of textual and graphical descriptions of a circuit, such as one in which a textual description refers to a schematic diagram for further description of a subcircuit, one in which a graphical description refers to a description language specification of a subcircuit, one some other type of combination. The high-level circuit design 150 may comprise a plurality of hierarchical levels, so that for example the circuit may be described at a first level using a graphical description, at a second level using a textual description, and at a third level using a combination of graphical and textual descriptions, with further levels being recursively described in similar manner. Graphical and textual descriptions of circuits are known in the art of circuit design.

In response to the high-level circuit design 150, and under direction of the tool user 130, the circuit design tool 110 generates a netlist 160 for a consolidated circuit which conforms to the high-level circuit design 150. The netlist 160 comprises a set of low-level elements and connections therebetween, such as individual gates or macros. Most fabrication descriptions include provisions for specifying simple macros, such as individual logic gates (such as "AND" gates, "OR" gates, and similar gates), and may also include provisions for specifying larger structures using macros, such as simple adders, shift registers, multiplexers, and even simple RAM, ROM, or cache memory designs. The netlist 160 also comprises physical placement information for circuit elements, and may also comprise routing information for wiring or other connections between circuit elements, such as actual routing tracks for placement of wiring connectors.

The netlist 160 comprises a description in a fabrication language, a database for fabrication, or another type of circuit fabrication description. In a preferred embodiment, the fabrication language is one of the fabrication languages shown in table 1-1.

TABLE 1-1

| | |
|---|---|
| DEF | a fabrication description language used by Cadence |
| EDIF | "Electronic Design Interchange Format", a standardized fabrication description language |
| PDEF | a fabrication description language used by Synopsis |
| Verilog | a fabrication description language used by Verilog |

In alternative embodiments, the fabrication language may comprise a set of programming masks for an FPGA (field programmable gate array), or similar product.

In further alternative embodiments, the fabrication language may comprise a description for a set of polygons for VLSI placement of gates and wires, in textual form, graphical form, or database form, or some combination thereof. In such alternative embodiments, the masks may be designed for "standard cell" or "full custom" design, or some combination thereof.

In further alternative embodiments, the fabrication language may comprise a set of masks for construction of an integrated circuit, such as a VLSI circuit, or a set of one or more masks for a mask-programmable circuit. In such alternative embodiments, the masks may be designed for "standard cell" or "full custom" design, or some combination thereof.

Figure 2:
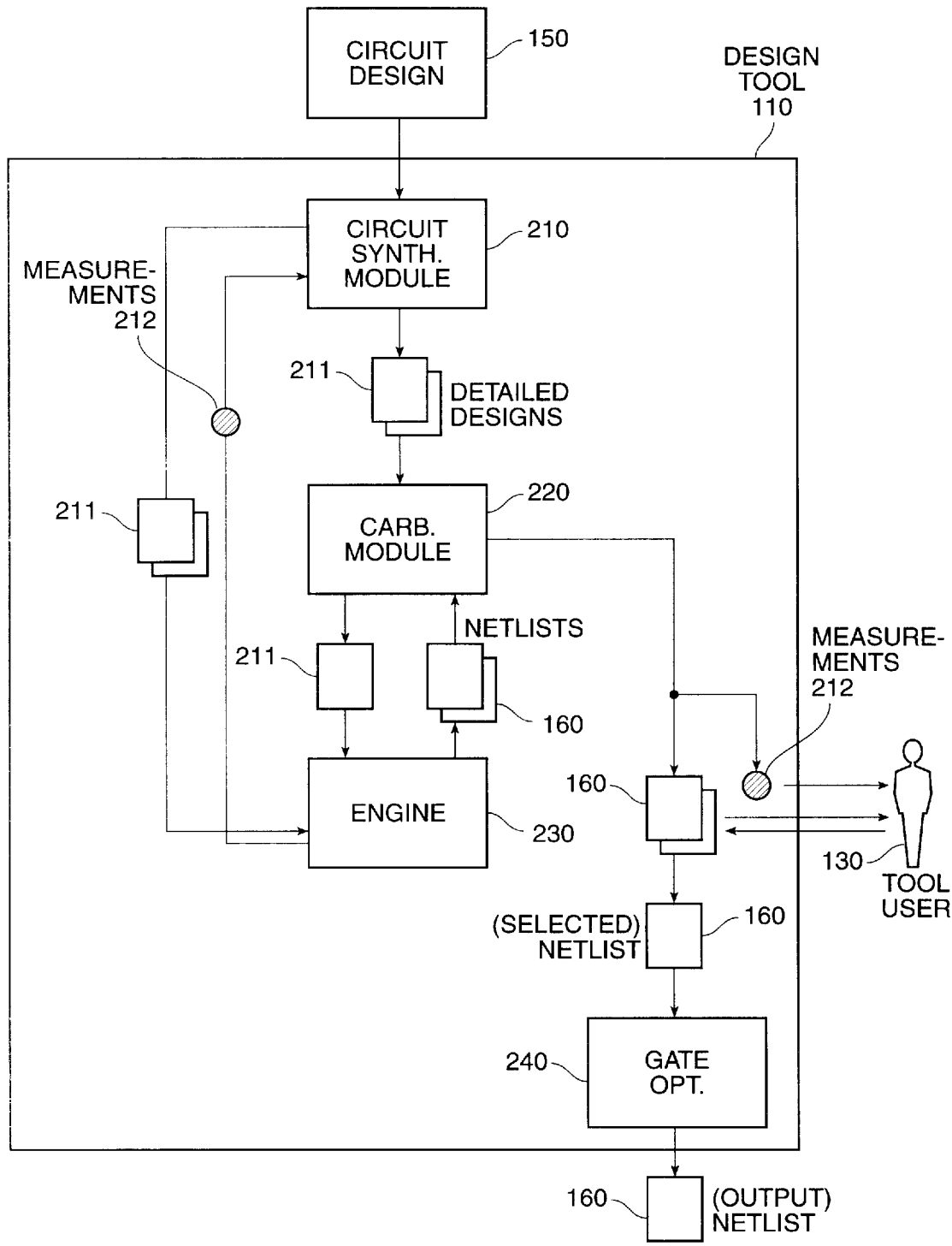
FIG. 2 shows a block diagram for a circuit design tool.

FIG. 2 shows a block diagram for a circuit design tool.

The circuit design tool 110 comprises a circuit synthesis module 210, a carburetor module 220, a component generator engine 230, and a gate optimizer 240.

The circuit design 150 from the tool user 130 is input to the circuit synthesis module 210, which determines one or more detailed designs 211 for a consolidated circuit in response thereto. To do this, the circuit synthesis module 210 selects and places individual components 152 and connections 154 relative to the input nodes 151 and the output nodes 153. The circuit synthesis module 210 generates a functional description 170 for each component 152, and transmits that functional description 170 to the engine 230. The engine 230 builds a netlist 160 for a component 152 conforming to that functional description 170, measures the area, power, and size used by that component 152, and reports those measurements 212 to the circuit synthesis module 210.

Because the circuit synthesis module 210 is able to obtain the measurements 212 for each component 152, it is able to optimize the detailed design 211 for the consolidated circuit with respect to area, power, or size. In practice, the measurements 212 are subject to a small amount of uncertainty, because it may occur that a particular component 152 must be built slightly larger or take slightly longer to operate, due to a requirement for routing signals through the area used by that component 152. Accordingly, where there are multiple detailed designs 211 which are nearly identical in their measurements 212, the circuit synthesis module 210 generates the multiple detailed designs 211 which it determines are best.

The detailed designs 211 are input to the carburetor module 220, which determines one or more netlists 160 for the consolidated circuit in response thereto. To do this, the carburetor module 220 also selects and places individual components 152 and connections 154 relative to the input nodes 151 and the output nodes 153. The carburetor module 220 obtains the functional description 170 for each component 152 from the detailed design 211, transmits that functional description 170 to the engine 230, retrieves a netlist 160 built by the engine 230 for that component 152, and integrates that netlist 160 into a consolidated netlist 160 for the consolidated circuit.

Because there are generally multiple netlists 160 which the engine 230 might build for any particular component 152, the carburetor module 220 also uses the measurements 212 for each component 152 to select which one of the netlists 160 should be used. Also, because there may be multiple consolidated netlists 160 which satisfy constraints given by the tool user 130 for the consolidated circuit, the carburetor module 220 may generate multiple consolidated netlists 160, along with a set of consolidated measurements 221, for presentation to the tool user 130.

The tool user 130 selects a single consolidated netlist 160, or the carburetor module 220 selects a single netlist 160 which satisfies the constraints imposed by the tool user 130. Thereafter, the consolidated netlist 160 is input to the gate optimizer 240, which locally adjusts gates in groups of one, two, or perhaps three, to optimize performance for area, power, speed, or other criteria, using logic optimization.

Logic optimization is known in the art. However, as described below, the gate optimizer 240 also uses optimization hints which are incorporated with the consolidated netlist 160 produced by the carburetor module 220.

Figure 3:
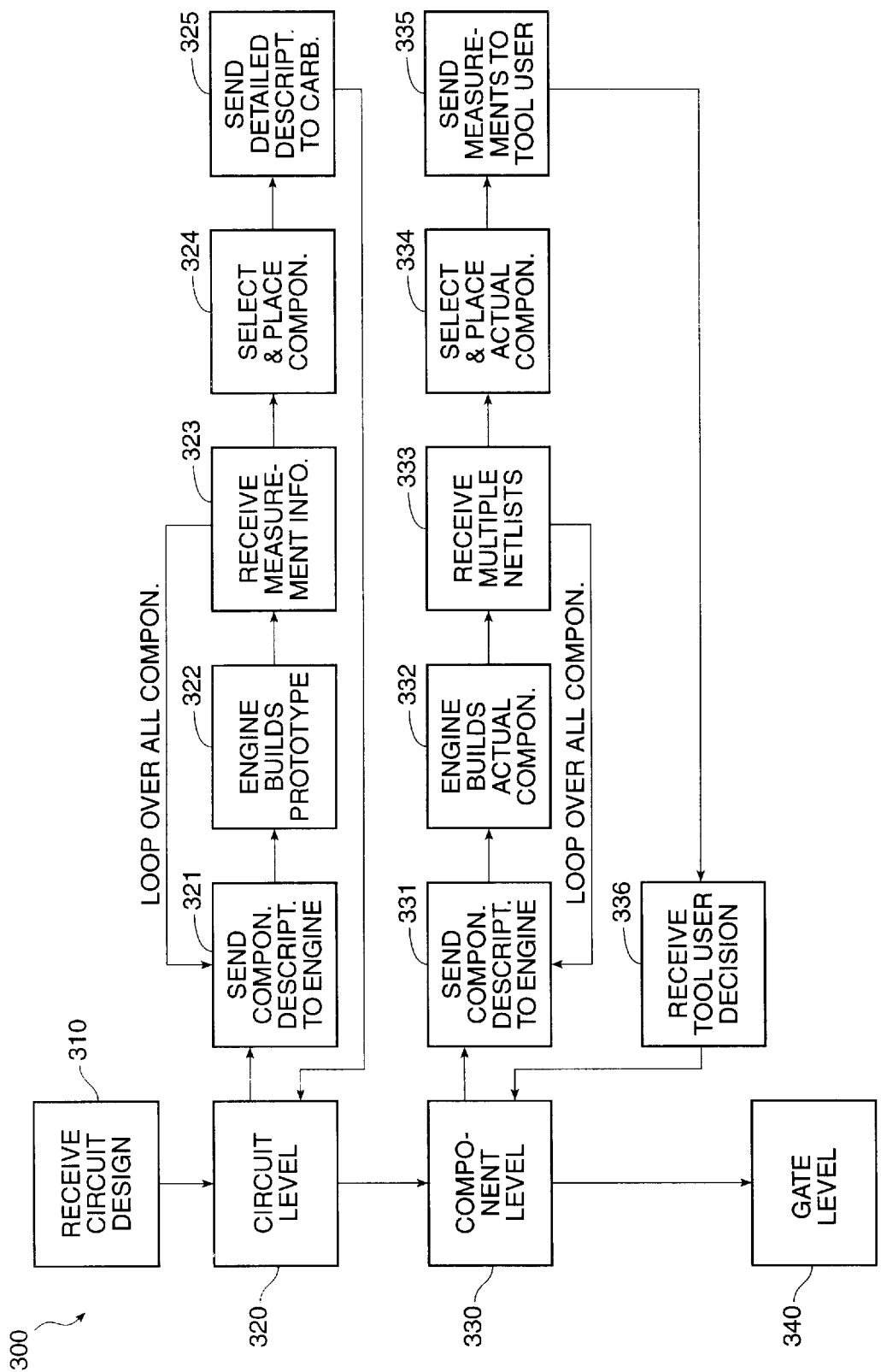
FIG. 3 shows a process flow diagram for a method of circuit design.
Figure 7A:
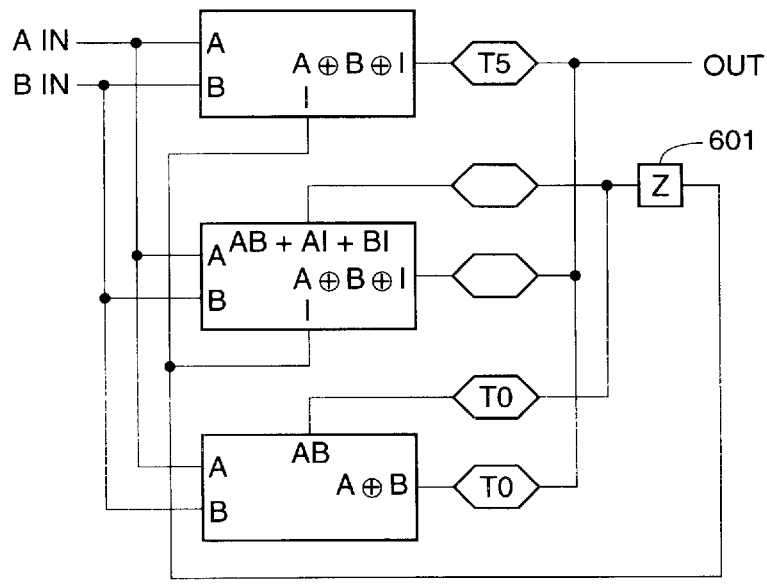
FIG. 7 (panels A, B, C, and D) shows stages in synthesizing a functional component responsive to a functional description and a structural description.
Figure 7B:
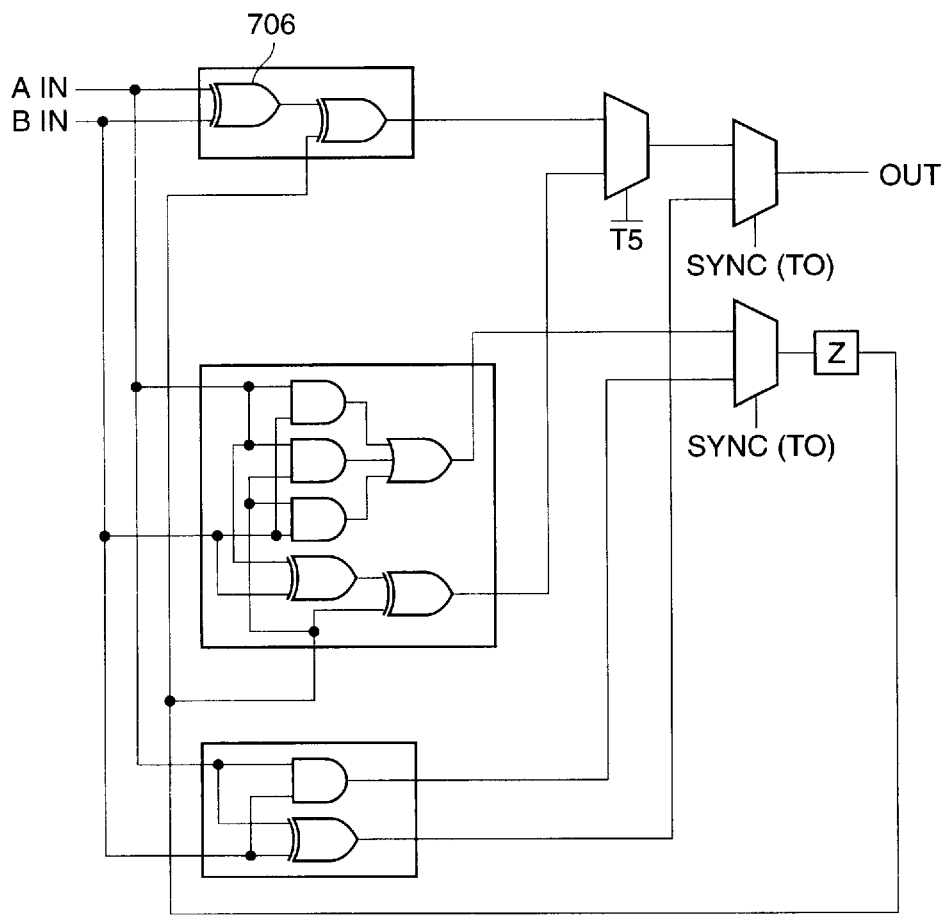
Figure 7C:
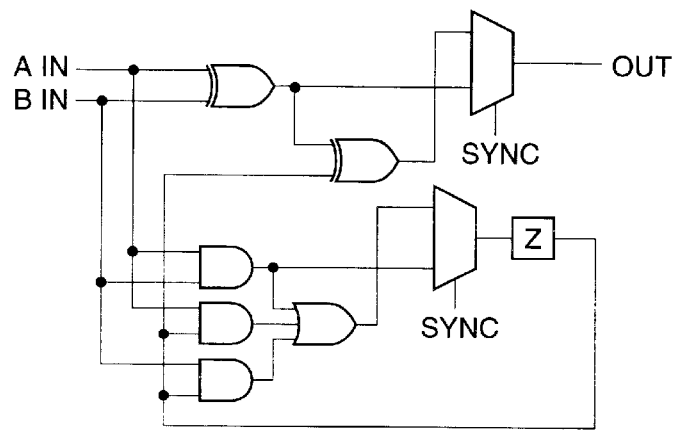
Figure 7D:
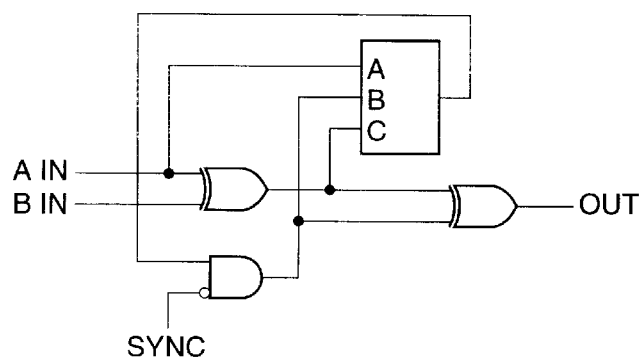

FIG. 3 shows a process flow diagram for a method of circuit design.

A method 300 of circuit design comprises step 310 through step 340 inclusive.

At a step 310, the circuit design tool 110 receives the circuit design 150 from the tool user 130. The circuit design 150 comprises a set of one or more input nodes 151, functional components 152, output nodes 153, and connections 154 between pairs of input nodes 151, functional components 152, and output nodes 153.

At a step 320, the circuit design tool 110 designs the circuit at a circuit level. To perform this step 320, the circuit design tool 110 performs step 321 through step 325 inclusive.

At a step 321, the circuit synthesis module 210 prepares a functional description 170 from the circuit design 150, and sends that functional description 170 to the component generator engine 230. The functional description 170 may be derived directly from one of the components 152 specified by the circuit design 150, or may be derived from one of the components 152 specified by the circuit synthesis module 210 in one or more equivalent circuit designs 150 constructed with reference to the circuit design 150 from the tool user 130. Constructing equivalent circuit designs 150 is known in the art.

At a step 322, the component generator engine 230 builds a prototype component 152 from the functional description 170, and generates measurement information 212 regarding optimizable parameters for the component 152. In a preferred embodiment, the measurement information 212 comprises the area of the prototype component 152, the speed of the prototype component 152, and the power consumed by the prototype component 152.

In a preferred embodiment, the speed of the prototype component 152 comprises four values. (a) A first value is a maximum delay time between any input and any output of the prototype component 152. This value is expressed for each possible input/output pair. (b) A second value is a minimum time required between any input value being ready and a clock edge. This value is also known as "setup time". (c) A third value is a minimum time required between a clock edge and any output value. This value is also known as output delay time. (d) A fourth value is a minimum time between clock edges. This value is also known as clock cycle time.

At a step 323, the circuit synthesis module 210 receives the measurement information 212 from the component generator engine 230 and associates that measurement information 212 with the prototype component 152.

The circuit design tool 110 iterates over step 321 through 323 until all components 152 specified by the circuit design 150, or by an equivalent circuit design 150, have been prototyped by the component generator engine 230 and their measurement information 212 has been associated with a corresponding component 152.

At a step 324, the circuit synthesis module 210 selects among the equivalent circuit designs 150 for one or more circuit design 150 whose aggregate measurement information 212 is best.

At a step 325, the circuit synthesis module 210 prepares one or more detailed designs 211, responsive to the selected equivalent circuit designs 150, and sends those detailed designs 211 to the carburetor module 220.

At a step 330, the circuit design tool 110 designs the circuit at a component level. To perform this step 330, the circuit design tool 110 performs step 331 through step 336 inclusive.

At a step 331, the carburetor module 220 prepares a functional description 170 from one of the detailed designs 211, and sends that functional description 170 to the component generator engine 230. The functional description 170 may be derived directly from one of the components 152 specified by the detailed designs 211, or may be derived from one of the components 152 specified by the carburetor module 220 in one or more equivalent circuit designs 150 constructed with reference to the detailed designs 211 from the circuit synthesis module 210. Constructing equivalent circuit designs 150 is known in the art.

At a step 332, the component generator engine 230 builds the component 152 from the detailed design 211, generates one or more netlists 160 for the component 152, and generates measurement information 212 regarding optimizable parameters for each such netlist 160. In a preferred embodiment, the component generator engine 230 builds several netlists 160 for each such component 152, using varying structural descriptions 180 (but the same functional description 170). Use of varying structural descriptions 180 with the same functional description 170 is described further herein.

At a step 333, the carburetor module 220 receives the netlist 160 and the measurement information 212 from the component generator engine 230.

The circuit design tool 110 iterates over step 331 through 333 until all components 152 specified by the detailed design 211 have been built by the component generator engine 230 and the measurement information 212 has been associated with corresponding components 152.

At a step 334, the carburetor module 220 selects among the netlists 160 for each component 152 so as to construct one or more consolidated netlists 160 whose aggregate measurement information 212 is best.

At a step 335, the carburetor module 220 presents the set of best aggregate measurement information 212 for the tool user 130 to choose just one.

At a step 336, the carburetor module 220 receives the selection made by the tool user 130 of which aggregate measurement information 212 is best, and sends the associated netlist 160 to the gate optimizer 240.

At a step 340, the circuit design tool 110 designs the circuit at a gate level. To perform this step 340, the gate optimizer 240 performs logic optimization on the netlist 160. Logic optimization is known in the art of circuit design.

In a preferred embodiment, in the course of performing the step 340, the gate optimizer 240 examines specific gates which have been tagged by the carburetor module 220 as likely to be subject to optimization. For example, in each component 152, specific gates are tagged when they are data outputs which are likely to require large fanout; since not all data outputs require large fanout, these gates may be optimized by making them smaller when large fanout is not required. Similarly, the carburetor module 220 tags specific gates as likely to be in the critical path for the consolidated netlist 160; if these gates are not in the critical path, it may be possible to make them smaller without any speed penalty.

SEPARATE STRUCTURAL AND FUNCTIONAL ASPECTS OF COMPONENTS

A first aspect of the invention provides a circuit design tool which separates structural and functional aspects of components. As shown herein, this aspect of the invention is primarily used by the component generator engine 230.

As shown herein, the functional description 170 and the structural description 180 for the component 152 are not dependent on each other. One or more different functional descriptions 170 may be applied to a given structural description 180; a given functional description 170 may be embodied in one or more different structural descriptions 180.

FIG. 4 shows example relationships between components 152, functional descriptions 170 for those components 152, and structural descriptions 180 for those components 152.

For example, a component 152 intended by the tool user 130 to be an adder may comprise one of several different functional descriptions 170 for a type of adder, such as a positive unsigned adder, a negative unsigned adder, a positive signed adder, or a negative signed adder. These functional descriptions 170 are distinct because they produce differing output values for the same input values.

Regardless of the functional description 170 of the adder component 152, it may independently comprise one of several different structural descriptions 180 types for a type of adder, such as a ripple carry adder, a carry select adder, or a serial adder. These structural descriptions 180 are distinct because, while they product identical output values for the same input values, they have differing characteristics of area, size, choice and number of gates, and connectivity.

Similarly, a component 152 intended by the designer to be a subtractor may comprise one of several different functional descriptions 170 for a type of subtractor, such as, a positive unsigned subtractor, a negative unsigned subtractor, a positive signed subtractor, or a negative signed subtractor. These functional descriptions 170 are distinct from the functional descriptions 170 for the several types of adder, as they produce differing output values for the same input values.

However, regardless of the differences in functional description 170 between the adder component 152 and the subtractor component 152, the subtractor component 152 may independently comprise one of the same structural descriptions 180 types as for a type of adder, such as a ripple carry subtractor, a carry select subtractor, or a serial subtractor.

FIG. 5 (panels A, B, C, and D) shows example functional descriptions 170.

In general, each component 152 comprises sets of input bits 501 $A_i$ and $B_i$, and a set of output bits 502 $O_i$, although an individual component 152 may comprise more or fewer sets of input bits 501 or more or fewer sets of output bits 502. For example, if a component 152 comprises an N-bit adder, there will be two sets of N input bits 501 $A_i$ and $B_i$ each representing an addend, an input bit 501 CI representing an input carry, a set of N output bits 502 $O_i$ representing the sum, and an output bit 502 CO representing an output carry.

In general, the N input bits 501 $A_i$ and $B_i$ and the N output bits 502 $O_i$ are indexed by an index i, so that each individual bit $A_i$, $B_i$, or $O_i$ is ordered within its particular set of N bits. Within each set of N bits (where i ranges from 0 to N−1 inclusive) $A_i$, $B_i$, or $O_i$, there is a least significant bit where i=0, a set of intermediate bits where 0<i<N−1, and a most significant bit where i=N−1. Least significant bits, intermediate bits, and most significant bits are known in the art of circuit design.

Those skilled in the art would recognize, after perusal of this application, that the functional description could differ significantly for different components, such as multiplexers, multipliers, or shift registers, but that constructions of such other components would be clear from the description in this application, would not require undue experimentation, and is within the scope and spirit of the invention. For example, while a design for a adder uses three different logic equations 503 f1, f2, and f3, a design for a multiplier might use five different logic equations 503 f1, f2, f3, f4, and f5.

In a preferred embodiment, the functional description 170 for each component 152 comprises a set of logic equations 503; these logic equations 503 indicate the output bits 502 for the component 152, responsive to the input bits 501 for that component 152. These logic equations 503 include a first logic equation 503 f1 describing the operation of the component 152 for the least significant bit, a second logic equation 503 f2 describing the operation of the component 152 for the intermediate bits, and a third logic equation 503 f3 describing the operation of the component 152 for the most significant bit.

In the functional description 170 for the positive unsigned adder component 152 (FIG. 5, panel A), the first logic equation 503 f1 (for the least significant bit) computes a carry output bit 502 C=AB, a logic product of its two inputs. The logic product is the "AND" of its two inputs, and may be computed with an AND gate or a NAND gate; logic products are known in the art of circuit design. The first logic equation 503 f1 also computes a sum output O=A⊕B, a modulo-two sum of its two inputs. The modulo-two sum is the "exclusive OR" of its two inputs, and may be computed with an XOR gate; modulo-two sums are known in the art of circuit design.

In the functional description 170 for the positive unsigned adder component 152, the second logic equation 503 f2 (for intermediate bits) computes a carry output C=AB+AI+BI, a logic sum of logic products of its inputs, where I=an intermediate carry bit, input from a next-less significant bit. The logic sum is the "OR" or its two inputs, and may be computed with an OR gate or a NOR gate; logic sums are known in the art of circuit design. The second logic equation 503 f2 also computes a sum output O=A⊕B⊕I, the modulo-two sum of its two inputs and the intermediate carry bit.

In the functional description 170 for the positive unsigned adder component 152, the third logic equation 503 f3 (for the most significant bit) computes only a sum output O=A⊕B⊕I, the modulo-two sum of its two inputs and the intermediate carry bit, and does not compute a carry output. In an alternative embodiment, a carry output bit CO may be computed similarly to the second logic equation 503 f2 (for intermediate bits).

The functional descriptions 170 for the negative unsigned adder (FIG. 5, panel B), for the positive unsigned subtractor (FIG. 5, panel C), and for the negative unsigned subtractor (FIG. 5, panel D), are similar. Note that an input bit 501 is marked with an overbar symbol to indicate logical negation, which may be computed with an inverter; logical negation is known in the art of circuit design.

Those skilled in the art would recognize, after perusal of this application, that functional descriptions 170 for other and further types of circuits would be readily apparent from the example functional descriptions 170 shown herein, that constructing functional descriptions 170 for such other and further types of circuits would not require undue experimentation, and that such other and further types of circuits are within the scope and spirit of the invention.

FIG. 6 (panels A, B, and C) shows example structural descriptions 180.

Each structural description 180 comprises a set of logic blocks 601 and a set of logic connections 602 between pairs of input bits 501, output bits 502, and logic blocks 601. Each one of the logic blocks 601 comprises a set of input values 603, a set of output values 604, and an indicator 605 of which logic equation 503 that logic block 601 applies to its input values 603 to generate its output values 604.

One or more of the logic blocks 601 may be set to a constant, not responsive to one of the logic equations 503. An example is shown in the "serial" structural description 180 (FIG. 6, panel C). A constant logic block 601 Z indicates a time delay of one serial bit; time delays and logic blocks 601 therefor are known in the art of circuit design.

Similarly, one or more of the input values 603 or output values 604 may be set to a constant 607, not responsive to one of the input bits 501. An example is shown in the "carry select" structural description 180 (FIG. 6, panel B), where one of the intermediate carry bits is set to a constant 607 logic "0" and a different one of the intermediate carry bits is set to a constant 607 logic "1".

At the step 322 and the step 332, the component generator engine 230 synthesizes, for each functional component 152, a portion of the netlist 160 for that component 152, responsive to the functional description 170 and to a selected structural description 180 for that component 152.

In a preferred embodiment, the portion of the netlist 160 for that component 152 comprises a netlist of circuit elements and connections therebetween. Netlists are known in the art of circuit design. The circuit elements may comprise gates, transistors, or other linear or nonlinear elements as appropriate to a target fabrication technology for the circuit design 150.

To perform the step 322 and the step 332, the component generator engine 230 performs five substeps.

FIG. 7 (panels A, B, C, and D) shows stages in synthesizing a functional component 152 responsive to a functional description 170 and a structural description 180.

In this example, the functional description 170 is for a positive unsigned parallel adder and the structural description 180 is for a serial structure.

At a first substep, the component generator engine 230 substitutes, in the structural description 180 for the component 152, the logic equations 503 from the functional description 170 for the component 152. To perform this substep, the component generator engine 230 substitutes the input values 603 for each logic block 601 for the variables used in the corresponding logic equation 503. FIG. 7, panel A, shows a result of the first substep.

At a second substep, the component generator engine 230 converts the logic equations 503 for each logic block 601 into a set of gates 606 (or other relatively simple elements). Techniques for performing this substep are known in the art of logic optimization. To perform this substep, the component generator engine 230 substitutes the set of gates 606 for the logic equations 503 determined in the first substep. FIG. 7, panel B, shows a result of the second substep.

At a third substep, the component generator engine 230 merges identical gates 606 and performs other switch-reduction optimization. Techniques for performing this substep are known in the art of logic optimization. To perform this substep, the component generator engine 230 substitutes a single gate 606 for each pair of gates 606 which have identical inputs, and couples outputs of that single gate 606 to all locations that outputs of the pair of identical gates 606 were coupled to. FIG. 7, panel C, shows a result of the third substep.

At a fourth substep, the component generator engine 230 simplifies the portion of the netlist 160 associated with the component 152. Techniques for performing this substep are known in the art of logic optimization. FIG. 7, panel D, shows a result of the fourth substep.

At a fifth substep, the component generator engine 230 couples together multiple bit cells to make a single multibit component. For example, for a four-bit adder component 152, the component generator engine 230 couples together one bit cell f1 for a least significant bit, two bit cells f2 for intermediate bits, and one bit cell f3 for a most significant bit.

AUTOMATED SELECTION OF STRUCTURAL DESCRIPTION

A feature of this aspect of the invention is that when the tool user has no preference for structural aspects of the component, the design tool may select a structure for the component which is in accord with the tool user's expressed goals (for example, area, power, or speed).

This aspect of the invention is performed at the step 335 and the step 336.

With the circuit design 150, the tool user 130 may present, for one or more components 152, only a functional description 170 for that component 152, and may refrain from selecting a structural description 180 to use for that component 152. In a preferred embodiment, the tool user 130 typically refrains from selecting structural descriptions 180 for virtually every component 152.

Also with the circuit design 150, the tool user 130 may present, either for each component 152 for which the tool user 130 refrained from presenting a structural description 180, or for the circuit design 150 considered as a whole, one or more circuit design goals. The tool user 130 selects one or more of these circuit design goals, such as, for example, to minimize the total circuit area of the component, to minimize the total power consumed by the component, to minimize the maximum processing delay imposed by the component.

As noted above, at the step 332, the component generator engine 230 builds the component 152 from the detailed design 211, generates one or more netlists 160 for the component 152, and generates measurement information 212 regarding optimizable parameters for each such netlist 160. Further, at the step 335 and the step 336, the carburetor module 220 presents measurement information 212 to the tool user 130 and receives a decision from the tool user 130.

In a preferred embodiment, the circuit design tool 110 uses the following technique:

(1) The circuit design tool 110 selects all possible structural descriptions 180 consistent with the functional description 170 for that component 152 (consistent with full or partial constraints imposed on structural descriptions 180 by the tool user 130), and synthesizes one or more circuits and their netlists 160 for the component 152 for each such structural description 180. In an alternative embodiment, the circuit design tool 110 may select only a subset of all possible structural descriptions 180 for synthesis.

(2) The circuit design tool 110 determines a measure for each circuit design goal, such as the total circuit area of the component 152, the total power consumed by the component 152, or the maximum processing delay imposed by the component 152, using each selected structural description 180.

In a preferred embodiment, the total circuit area of the component 152 is determined by preparing a circuit layout for the netlist 160 developed for the component 152, determining a circuit area for each circuit element and for connections used for the component 152, and summing to produce a total circuit area.

In a preferred embodiment, the total power consumed by the component 152 is determined by determining a power consumption for each circuit element and for connections used in the netlist 160 for the component 152, and summing to produce a total power consumption.

In a preferred embodiment, the speed of the component 152 is computed as follows: (a) The maximum delay time imposed by the component 152 is determined by determining a processing delay for each input node 151 to each output node 153, for each possible set of input values, and selecting a maximum to produce a maximum processing delay. (b) The minimum setup time imposed by the component 152 is determined by determining a required setup time for each input node 151, for each possible set of input values, and selecting a maximum to produce a minimum setup time. (c) The minimum output delay time imposed by the component 152 is determined by determining a required output delay time for each output node 153, for each possible set of input values, and selecting a maximum to produce a minimum output delay time. (d) The minimum clock cycle time imposed by the component 152 is determined by determining a required clock cycle time for each possible path between pairs of latches within the component 152, and selecting a maximum to produce a minimum clock cycle time.

(3) The circuit design tool 110 selects the structural description 180 which best achieves the one or more design goals presented by the tool user 130.

In a preferred embodiment, in the case that the tool user 130 presents multiple design goals for the component 152, such as for example both to minimize the total circuit area of the component 152 and to minimize the maximum processing delay imposed by the component 152, the circuit design tool 110 presents a set of measurement results for the design goals, and the tool user 130 selects the one of the measurement results, and consequently one of the structural descriptions 180, which best satisfies all the design goals at once.

In a preferred embodiment, in the case that the tool user 130 does not present any design goals for the component 152, the circuit design tool 110 presents a set of measurement results for all (or a subset of all) available design goals, and the tool user 130 selects the one of the measurement results, and consequently one of the structural descriptions 180, which best pleases the tool user 130 for whatever reasons the tool user 130 may have.

In a preferred embodiment, the set of measurement results for the design goals are presented in graphic and in tabular form, so the tool user 130 may examine the tradeoff relationship between two or more alternative design goals. (In the case that there are more than two alternative design goals, the graphic form may comprise a three-dimensional graph using colors, perspective, or symbols to show more than two dimensions.) For example, it may occur that to decrease the processing delay imposed by the component 152 generally requires increasing the total circuit area of the component 152, and vice versa. In this case, the circuit design tool 110 will present the tool user 130 with a graph and a table showing how much an improvement in one design goal will require a tradeoff for the other design goal, so the tool user 130 will best be able to select a single circuit design.

In an alternative embodiment, the tool user 130 may specify more detailed requirements, such as setting specific design criteria for one or more design goals, and leaving the circuit design tool 110 to optimize the other design goals within those parameters. For example, the tool user 130 may specify that the component 152 must take no more than 50 nanoseconds maximum processing delay and no more than 500 square microns area, and direct the circuit design tool 110 to optimize the circuit design so as to minimize total power consumption within those parameters. If the circuit design tool 110 is not able to find a circuit design within those parameters, it would of course so notify the tool user 130 and revert to the preferred embodiment described just above, in which the circuit design tool 110 will present the tool user 130 with a graph and a table, so the tool user 130 will be able to select a single circuit design.

Those skilled in art would recognize, after perusal of this application, that area, speed, and power consumption are not the only available design goals which can be optimized, that construction and operation of the design tool 110 to incorporate and optimize for other design goals would be clear from the description and would not require undue experimentation, and that such alternative design goals are within the scope and spirit of the invention. For example, such alternative design goals might include one or more of the following: expected yield, rad hardness, RF generation, routing congestion, testability, thermal gradient, total wiring length, or any other measurable metric or some combination thereof.

In alternative embodiments, the library of structural descriptions 180 may comprise annotations to the effect that certain structural descriptions 180 are preferred to achieve known design goals. For example, the library may annotate the "carry select" structural description 180 to the effect that it is preferred for minimizing processing delay for the component 152, so the circuit design tool 110 may select that structural description 180 without further testing if minimizing processing delay is the design goal presented by the designer.

TRANSLATING BEHAVIOR MODELS INTO REGULARIZED COMPONENTS

A second aspect of the invention provides a circuit design tool which translates desired logical behavior of a circuit into a regularized set of functional components to achieve that desired behavior.

Figure 8:
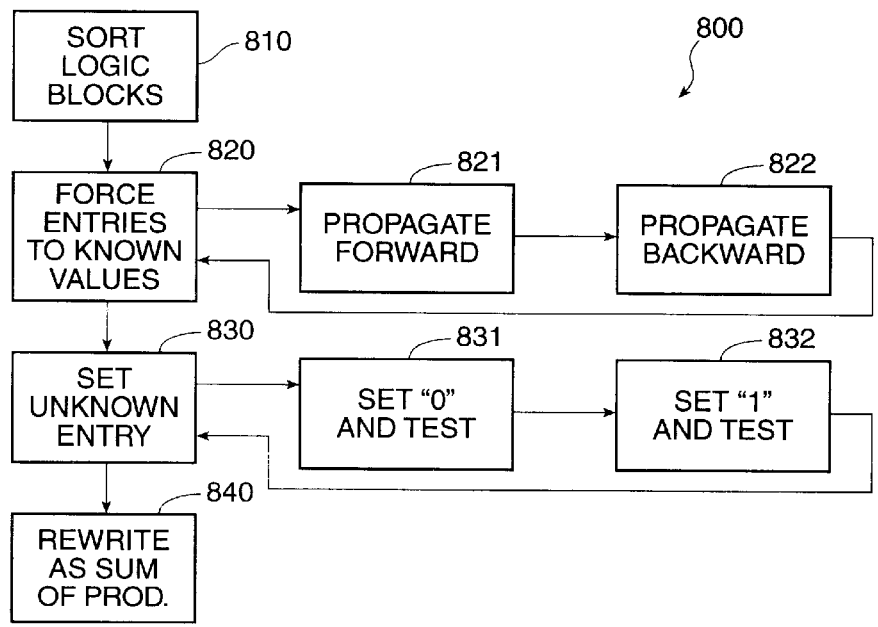
FIG. 8 shows a process flow diagram for a method of component design.

FIG. 8 shows a process flow diagram for a method of component design.

Figure 9:
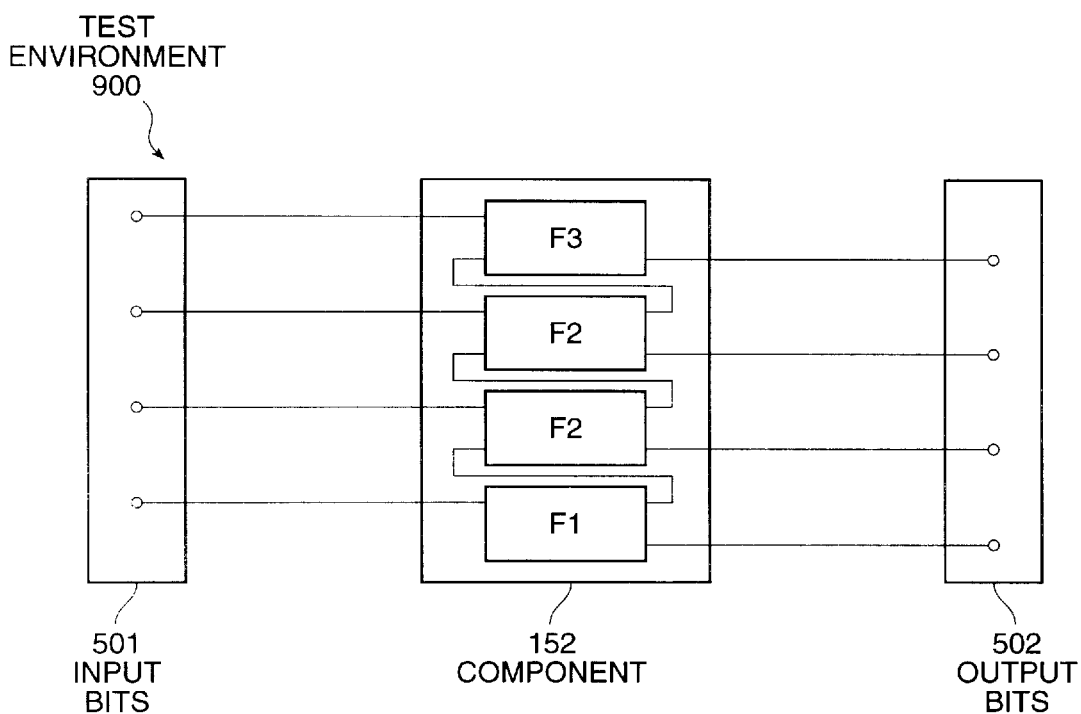
FIG. 9 shows a block diagram for a component and its testing environment.

FIG. 9 shows a block diagram for a component and its testing environment.

A method 800 of component design uses a testing environment 900, the testing environment 900 comprising the component 152 coupled to its input bits 501 and its output bits 502. In the method 800, the input bits 501 and the output bits 502 are selected to equal one or more test cases for the component 152 to satisfy, and the component 152 is synthesized which satisfies those test cases.

As described with reference to FIG. 3, the structural description 180 of the component 152 comprises one or more logic blocks 601 and logic connections 602 between pairs of input bits 501, output bits 502, and logic blocks 601. However, in the method 100 of circuit design, the logic equations 503 to be used for each logic block 601 are already known. Instead, in the method 800 of component design, the logic equations 503 to be used for each logic block 601 are to be determined responsive to the test cases for the component 152 to satisfy.

In a preferred embodiment, the method 800 uses a first logic equation 503 f1, a second logic equation 503 f2, and a third logic equation 503 f3, as in the method 100, to describe the component 152. However, in alternative embodiments the method 800 may use additional logic equations 503 as specified by the tool user 130. Moreover, the method 800 might not be able to finds a set of regularized functional components for a particular set of logic equations 503 or a particular structural description 180; in that circumstance, the method 800 could be applied with a different set of logic equations 503 or a different structural description 180.

FIG. 11 shows an example set of test vectors 1100 from which the logic equations 503 are determined.

Each one of the test vectors 1100 comprises the input bits 501 and the output bits 502 intended for the component 152. Each entry 1110 in the test vectors 1100 represents an input bit 501 in a selected combination of input bits 501, or an output bit 502 in a combination produced responsive to that combination of input bits 501. In this example, the input bits 501 represent a 4-bit binary integer and the output bits 501 represent a 4-bit binary integer which is one greater than that represented by the input bits 501. Thus, the example test cases 1100 are for a 4-bit counter.

Figure 12:
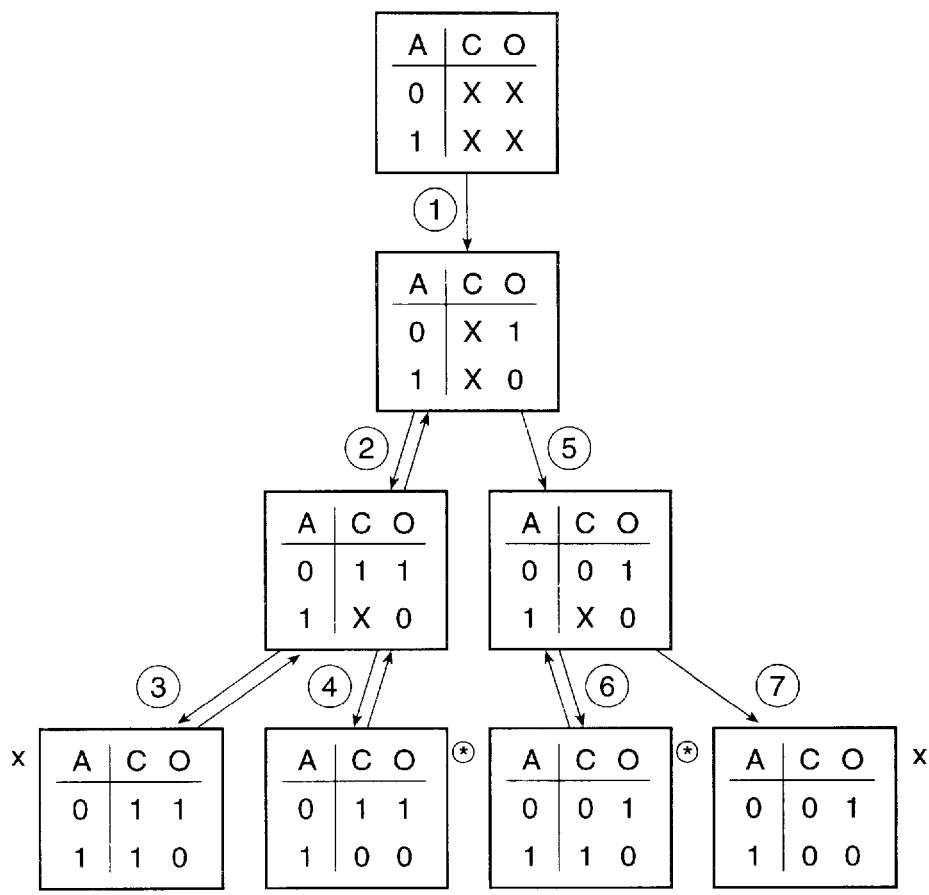
FIG. 12 shows example sets of stimulus/response vectors for each of the logic equations, determined responsive to the test vectors.

FIG. 12 shows example sets of stimulus/response vectors 1200 for the logic equation 503 f1, determined responsive to the test vectors 1100.

Each of the stimulus/response vectors 1200 correlates possible inputs with possible outputs for one of the logic equations 503. In this example, the first logic equation 503 f1 has one input A and two outputs C and O.

At a starting point for the method 800, all logic equation 503 f1, f2, and f3 start with all truth table entries 1210 marked "x". The truth table entries 1210 are successively refined as shown in the figure, using the method 800, by recursively examining truth tables 1220, shown in the figure as a tree structure of truth tables 1220, to reach one or more truth tables 1220 satisfying the requirements of the test vectors 1200. More than one truth table 1220 may be satisfactory; for example, carry polarity may be either positive or negative.

Eight tables 1220 of entries 1210 are shown, correlating possible inputs with possible outputs as the method 800 is performed. One final set of entries 1210, marked with an asterisk, shows that for the first logic equation 503, input A=0 must cause outputs C=1 and O=1, while input A=1 must cause outputs C=0 and O=0.

Each entry 1210 in the stimulus/response vectors 1200 represents an output for a selected logic equation 503, corresponding to a selected set of inputs for the logic equation 503. The entry 1210 may be set to "0", indicating that the output must be 0 when those inputs are received, set to "1", indicating that the output must be 1 when those inputs are received, or set to "X", indicating that the required output value is unknown or undetermined when those inputs are received.

Figure 10:
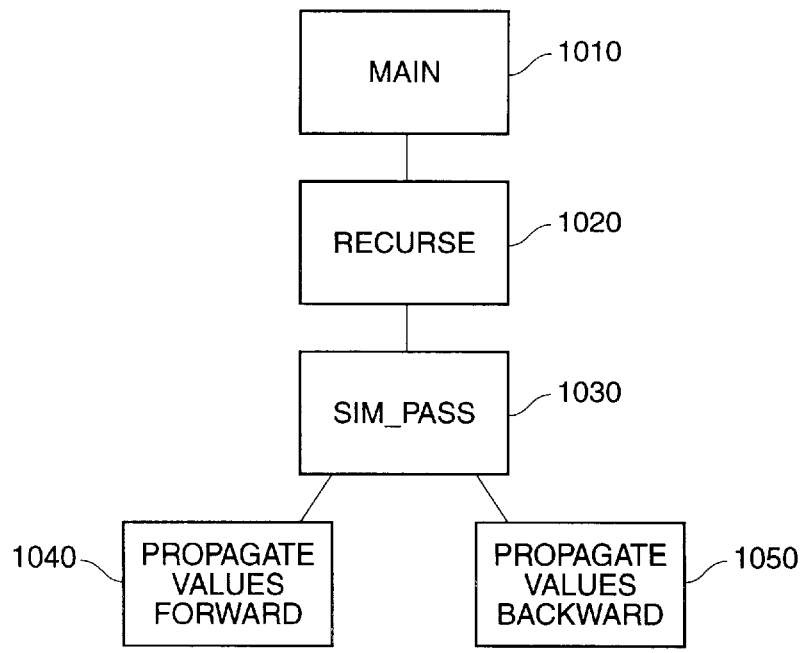
FIG. 10 shows a block diagram of a set of software elements for performing the method of FIG. 8.

FIG. 10 shows a block diagram of a set of software elements for performing the method of FIG. 8.

The method 800 comprises the steps 810 through 840 inclusive, is performed by the circuit design tool 110, and is described with reference to pseudocode for a set of procedures main 1010 (shown herein at table 10-1), recurse 1020 (shown herein at table 10-2), sim_pass 1030 (shown herein at table 10-3), propagate_values_forward 1040 (shown herein at table 10-4), and propagate_values_backward 1050 (shown herein at table 10-5). The pseudocode uses natural language descriptions of processor actions with the syntax of a programming language. Pseudocode is known in the art of programming.

Table 10-1 shows a pseudocode representation of a procedure main 1010 for the method 800.

TABLE 10-1

```
procedure main ()
begin
        sort_boxes ();
        recurse ();
end
```

The procedure main 1010 initiates the recursion activity.

Table 10-2 shows a pseudocode representation of a procedure recurse 1020 for the method 800.

TABLE 10-2

```
procedure recurse ()
begin
        i = sim_pass ();
        if (i == "working solution")
                print_solution ();
        if (i == "inconsistency")
                return;
        checkpoint ();
                ref = find any_x_in_table ();
                set_high (ref);
                recurse ();
                uncheckpoint ();
        checkpoint ();
                set_low (ref);
                recurse ();
                uncheckpoint ();
end
```

The procedure recurse 1020 looks for one of the truth table entries 1210 which is marked "x", arbitrarily sets that entry 1210 to logic "1" and looks for a consistent solution, then arbitrarily sets that entry 1210 to logic "0" and looks for a consistent solution. In each case, setting one entry 1210 to either logic "1" or logic "0" may cause the values of other entries 1210 to become known; if there remain entries 1210 with values still unknown (that is, equal to "x"), the procedure recurse 1020 calls itself to recursively determine values for those entries 1210.

Table 10-3 shows a pseudocode representation of a procedure sim_pass 1030 for the method 800.

TABLE 10-3

```
procedure sim_pass ()
begin
        for each test vector
                set all input/output pins to the given values
                propagate_values_forward ()
                if any output driver is inconsistent
                        return ("inconsistency");
                if any table has an X
                        propagate values_backward ();
                if any table has an X
                        return ("some Xs left");
                return ("working solution");
end
```

The procedure sim_pass 1030 determines values for truth table entries 1210 in response to truth table entries 1210 which are already known.

Table 10-4 shows a pseudocode representation of a procedure propagate_values_forward 1040 for the method 800.

TABLE 10-4

```
procedure propagate_values_forward ()
begin
        for each logic block in list
                if all inputs have non-"x" values
                begin
                        find appropriate line in table
                        set outputs accordingly
                        next logic block;
                end
                ; at this point some inputs have "x" values
                try setting "x" inputs to all possible cases
                for each setting, determine how outputs would
                        be driven
                if any output would consistently be driven
                        (regardless of input)
                        set output accordingly
        end for-loop
end
```

The procedure propagate_values_forward 1040 propagates values of truth table entries 1210 forward, by determining outputs of logic equations 503 and gates in the component responsive to known inputs.

Table 10-5 shows a pseudocode representation of a procedure propagate_values_backward 1050 for the method 800.

TABLE 10-5

```
procedure propagate_values_backward ()
begin
        for each logic block in list, backwards
                if all inputs have non-"x" values
                begin
                        find appropriate line in table
                        if any output has non-"x" value
                                set table entry accordingly
                        next logic block;
                end
                ; at this point some inputs have "x" values
                try setting "x" inputs to all possible cases
                for each setting, if outputs would conflict
                        prohibit this input combination
                if any inputs are restricted to single value
                        set that input accordingly
        end for-loop
end
```

The procedure propagate_values_backward 1050 propagates values of truth table entries 1210 backward, by determining inputs of logic equations 503 and gates in the component responsive to known outputs.

At a step 810, the circuit design tool 110, executing in the routine main 1010, calls a routine sort_boxes (not shown) to sort a list of the logic blocks 601 in the component 152. Sorting the list of logic blocks 601 is not required, but does make the method 800 faster and more efficient, and so is preferred. The logic blocks 601 are sorted so that if an output of a logic block 601 X is coupled to an input of a logic block 601 Y, the logic block 601 X will precede the logic block 601 Y when the list of logic blocks 601 is sorted.

At a step 820, the circuit design tool 110, executing in the routine main 1010, calls the routine recurse 1020. The circuit design tool 110, executing in the routine recurse 1020, calls the routine sim_pass 1030 to determine those entries 1210 in the stimulus/response vectors 1200 which are forced to known values ("0" or "1"). An entry 1210 is forced to a known value when the opposite value would be inconsistent with the test vectors 1100.

To perform this step 820, the circuit design tool 110 performs the steps 821 through 822 inclusive.

At a step 821, the circuit design tool 110, executing in the routine sim_pass 1030, calls the routine propagate_values_forward 1040, which propagates logical values forward from inputs to outputs.

At a step 822, the circuit design tool 110, executing in the routine sim_pass 1030, calls the routine propagate_values_backward 1050, which propagates logical values backward from outputs to inputs.

At a step 830, the circuit design tool 110, executing in the routine recurse 1020, selects an "x"-valued entry 1210 in the stimulus/response vectors 1200 and attempts to set that entry 1210 to "0" or "1".

To perform this step 830, the circuit design tool 110 performs the steps 831 through 832 inclusive.

At a step 831, the circuit design tool 110, executing in the routine recurse 1020, tentatively sets the selected entry 1210 to "0" and tests for consistency. The circuit design tool 110 uses the following technique:

(1) The circuit design tool 110 sets a checkpoint indicating the current state of the stimulus/response vectors 1200.
(2) The circuit design tool 110 sets the selected "x"-valued entry 1210 to "0".
(3) The circuit design tool 110 calls the routine sim_pass 1030, to further determine those entries 1210 in the stimulus/response vectors 1200 which are forced to known values ("0" or "1").
(4) The circuit design tool 110 returns from the routine sim_pass 1030 with a return value indicating whether (a) all entries 1210 have been forced to known values, (b) further "x"-valued entries 1210 remain, or (c) an inconsistency was discovered.
(5) If all entries 1210 have been forced to known values, a complete solution for the stimulus/response vectors 1200 has been found, and the method 800 is complete. If further "x"-valued entries 1210 remain, the circuit design tool 110 recursively re-performs the step 830. If an inconsistency was discovered, the circuit design tool 110 backtracks to the checkpoint, forces the selected "x"-valued entry 1210 to "1" instead of "0", and recursively re-performs the step 830.

At a step 832, the circuit design tool 110, executing in the routine recurse 1020, tentatively sets the selected entry 1210 to "1" and tests for consistency. The circuit design tool 110 uses the same technique as in the step 831, except that the selected entry 1210 is tentatively set to "1" instead of "0".

After the circuit design tool 110 completes the step 830, all entries 1210 in the stimulus/response vectors 1200 have been set.

At a step 840, the circuit design tool 110 places the logic equations 503 in a sum-of-products form. Table 12-1 shows two sets of logic equations for the component which are possible results of the step 840.

TABLE 12-1

| Function | Logic Equations (1) | Logic Equations (2) |
|---|---|---|
| F1 | O = ¬A<br>C = A | O = ¬A<br>C = ¬A |
| F2 | O = A ⊕ I<br>C = AI | O = ¬(A ⊕ I)<br>C = (¬A) + I |
| F3 | O = A ⊕ I | O = ¬(A ⊕ I) |

In table 12-1, the symbol "⊕" represents addition modulo-two and the symbol "¬" represents logical inversion.

VERIFYING STRUCTURAL EQUIVALENCE

A third aspect of the invention provides a circuit design tool which verifies structural equivalence between pairs of components. For example, a first component may have a ripplecarry structure while a second component may have a serial carry-chain structure.

Figure 13:
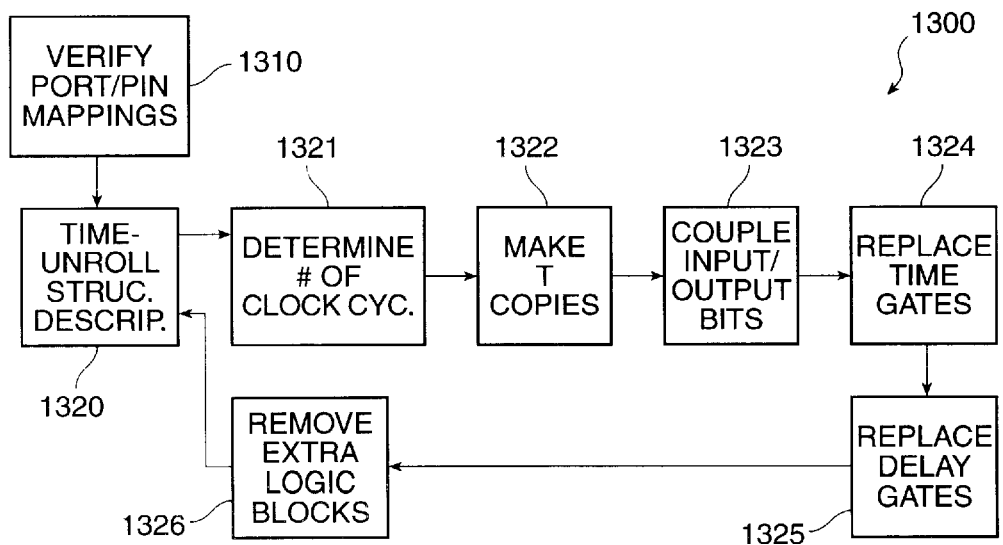
FIG. 13 shows a process flow diagram for a method of verifying structural equivalence.

FIG. 13 shows a process flow diagram for a method of verifying structural equivalence.

A method 1300 of verifying structural equivalence operates on first and second selected structural descriptions 180. In general, the method 1300 determines if the two structural descriptions 180 are unequivocally equivalent (i.e., equivalent for all possible functional descriptions 170), are conditionally equivalent (i.e., equivalent for some but not all possible functional descriptions 170), or are not equivalent.

As described with reference to FIG. 3, the first and second structural descriptions 180 of the component 152 each comprise one or more logic blocks 601 and logic connections 602 between pairs of input bits 501, output bits 502, and logic blocks 601. However, in the method 100 of circuit design, the logic equations 503 to be used for each logic block 601 are already known. Instead, in the method 1300 of verifying structural equivalence, the logic equations 503 to be used for each logic block 601 are considered to be undetermined.

One or more logic blocks 601 may each comprise a delay gate or a time gate.

A delay gate has an input and an output, and provides that its output is equal to its input, but delayed one clock cycle.

A time gate has an input, an output, and a designated clock cycle. During its designated clock cycle, the time gate is active and acts like a direct connection; i.e., its output is equal to its input. During all other clock cycles, the time gate is not active and acts like a broken connection; i.e., its output is not responsive to its input. The designated clock cycle may be a specific clock cycle, or may be "wild"; a wild time gate is active when and only when there is no other active time gate coupled to its output. Thus for any net there may be at most one wild time gate with its output coupled to that net.

The method 1300 of verifying structural equivalence comprises a set of steps 1310 through 1343 inclusive, and is performed by the circuit design tool 110.

At a step 1310, the circuit design tool 110 verifies that the port/pin mappings (i.e., the input pins 501 and their corresponding input data) of the two structural descriptions 180 are compatible. The circuit design tool 110 determines that for each port/pin in the first structural description 180, there is an equivalent port/pin in the second structural description 180. The circuit design tool 110 also performs the reverse check; it determines that for each port/pin in the second structural description 180, there is an equivalent port/pin in the first structural description 180.

At a step 1320, the circuit design tool 110 "time-unrolls" the first and second structural descriptions 180. This is only necessary if there are delay gates or time gates in at least one of the two structural descriptions 180.

To perform this step 1320, the circuit design tool 110 performs the steps 1321 through 1326 inclusive.

At a step 1321, the circuit design tool 110 determines a number T of significant clock cycles. The number T is the number of clock cycles from the earliest clock cycle used to the latest clock cycle used. A clock cycle is considered "used" if any of the time gates is active during that clock cycle, if a bit appears at an input node during that clock cycle, or if a bit is valid at an output node during that clock cycle.

At a step 1322, the circuit design tool 110 constructs T copies of the structural description 180, one for each of the T significant clock cycles.

At a step 1323, the circuit design tool 110 couples input bits 501 and output bits for each clock cycle to corresponding copies of the structural description 180.

At a step 1324, the circuit design tool 110 replaces each time gate for each clock cycle with either a wire or an open circuit, responsive to whether that time gate is active in that clock cycle.

At a step 1325, the circuit design tool 110 replaces each delay gate with a connection from its clock cycle t to a next clock cycle t+1. The input for a delay gate in clock cycle t is coupled to the output for the corresponding delay gate in clock cycle t+1. The output for any delay gate in the earliest clock cycle remains uncoupled; so does the input for any delay gate in the latest clock cycle.

At a step 1326, the circuit design tool 110 removes those logic blocks 601 whose outputs are not propagated to any output bit and therefore cannot affect any output bit.

Figure 14:
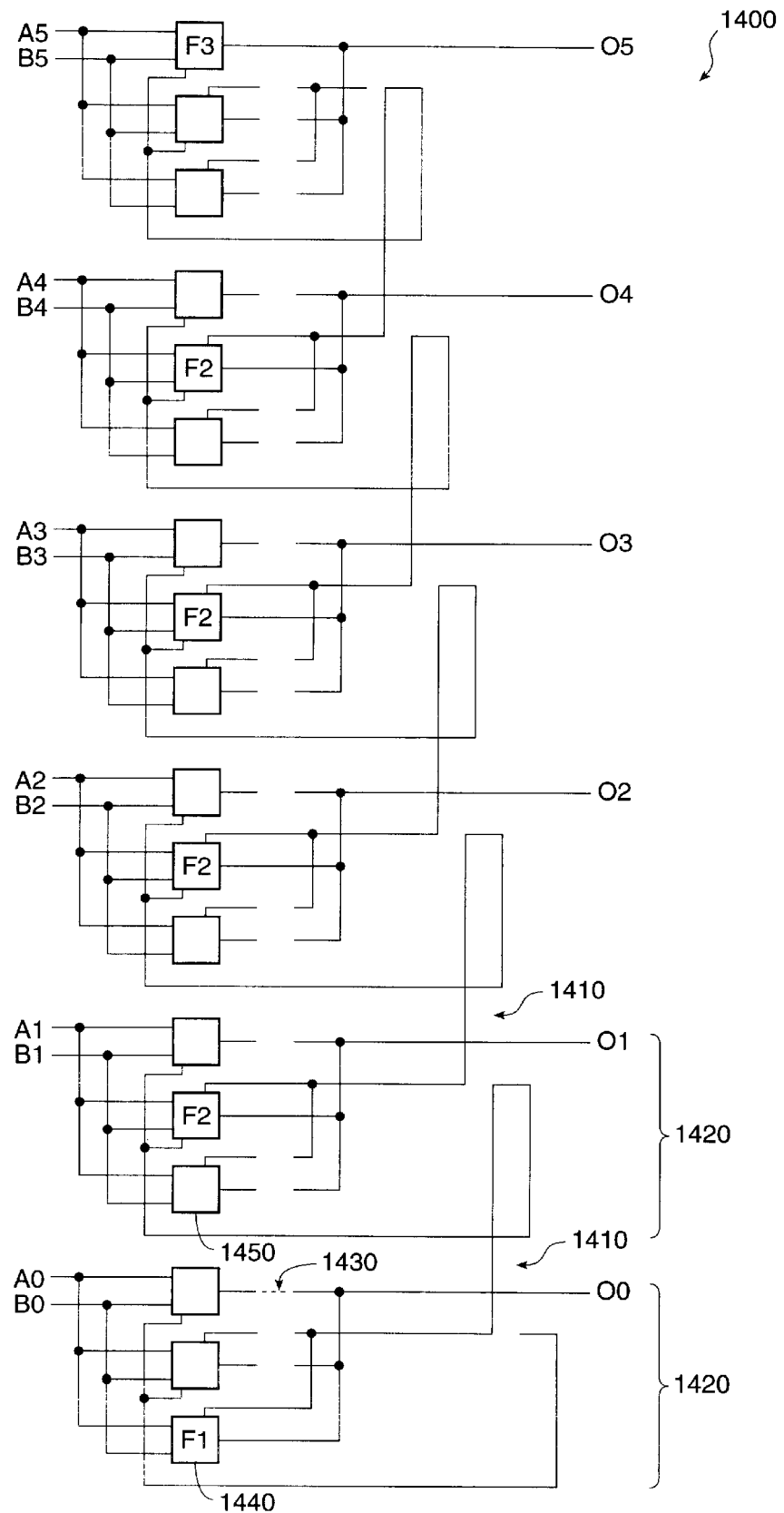
FIG. 14 shows a result of applying a method of verifying structural equivalence.

FIG. 14 shows a result of time-unrolling a structural description.

The circuit design tool 110 constructs T copies of an individual stage 1420 (in this example, T=6). Each time gate is replaced with either a wire 1410, or an open circuit 1430.

Those elements 1440 which are coupled to at least one other element are retained; those elements 1450 which are not coupled to at least one other element (so that they can have some effect on at least one output bit 502) are moved.

At a step 1330, the circuit design tool 110 applies a set of replacement rules to the first and second structural descriptions 180. Each of the rules has a right part and a left part. The circuit design tool 110 examines the first structural description 180 for logic blocks 601 and logic connections 602 therebetween which correspond to the right part of one of the rules, and replaces that right part with the left part of the same rule. The circuit design tool 110 repeats this step 1330 until all possible rules have been used.

Applying a set of replacement rules to an object is known in the art of logical production systems, such as those used in programming language compilers. With the present invention, an advance is made over those systems in that a logical production system is applied to a structural description 180 for a component 152.

Figure 15:
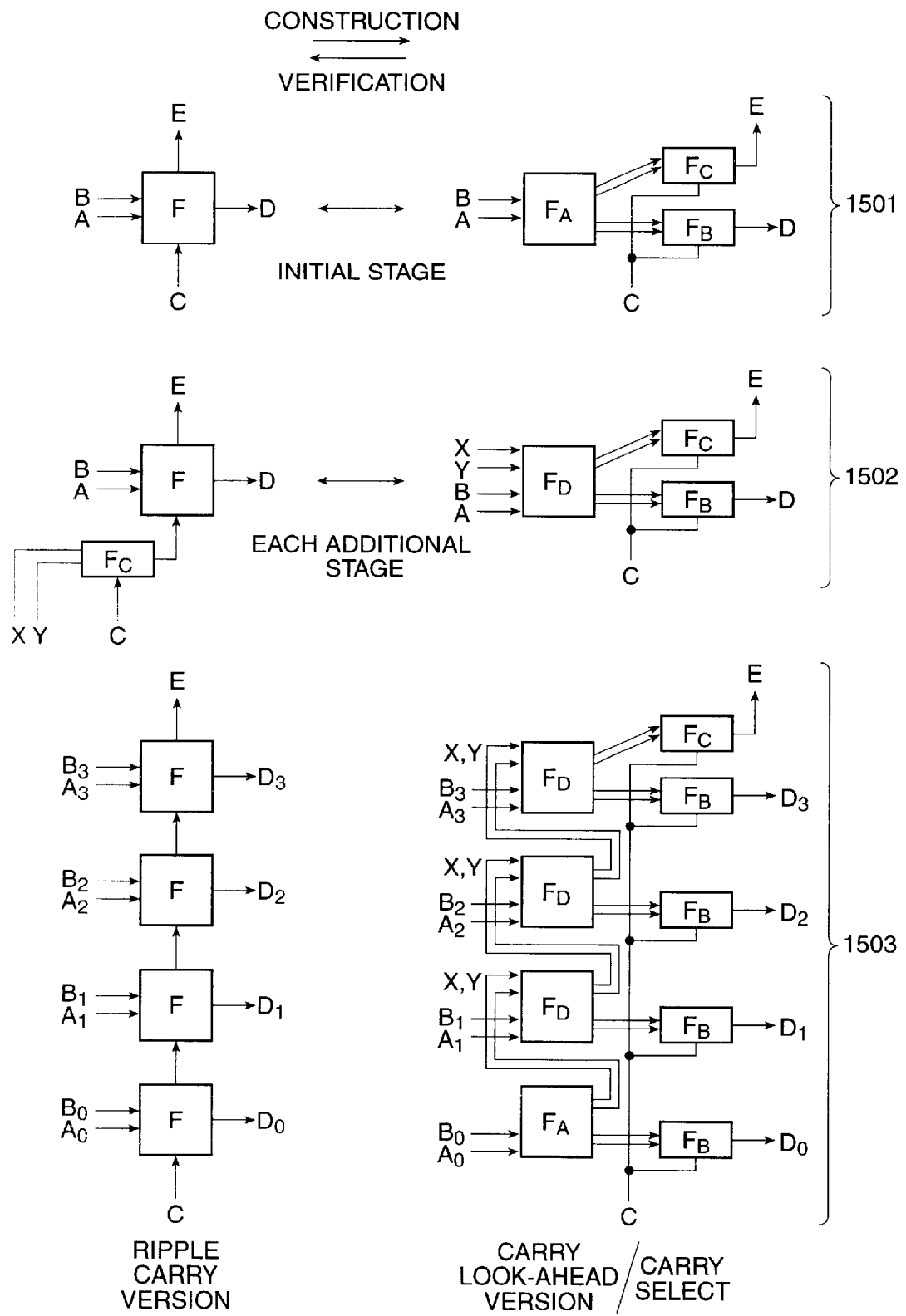
FIG. 15 shows example replacement rules for a method of verifying structural equivalence.

FIG. 15 shows example replacement rules for a method of verifying structural equivalence.

A first replacement rule 1501 applies to the initial stage in those components 152 having a parallel structural description 180.

A second replacement rule 1502 applies to each additional stage in those components 152 having a parallel structural description 180.

A third replacement rule 1503 shows the equivalence of a ripple carry structural description 180 and a carry lookahead or carry select structural description 180.

Other and further rules may be constructed by selecting a left part which may be simplified, and associating the left part with a right part which is a simplified, yet equivalent, set of elements.

Those skilled in the art would recognize, after perusal of this application, that other and further replacement rules would be readily apparent from the example replacement rules shown herein, that constructing such other and further replacement rules would not require undue experimentation, and that such other and further replacement rules are within the scope and spirit of the invention.

At a step 1340, the circuit design tool 110 verifies equivalence of the first and second structural descriptions 180 resulting from the step 1330. At this point, the modified first and second structural descriptions 180 should be identical if the original first and second structural descriptions 180 were truly equivalent.

To perform this step 1340, the circuit design tool 110 performs the steps 1341 through 1343 inclusive.

Figure 16:
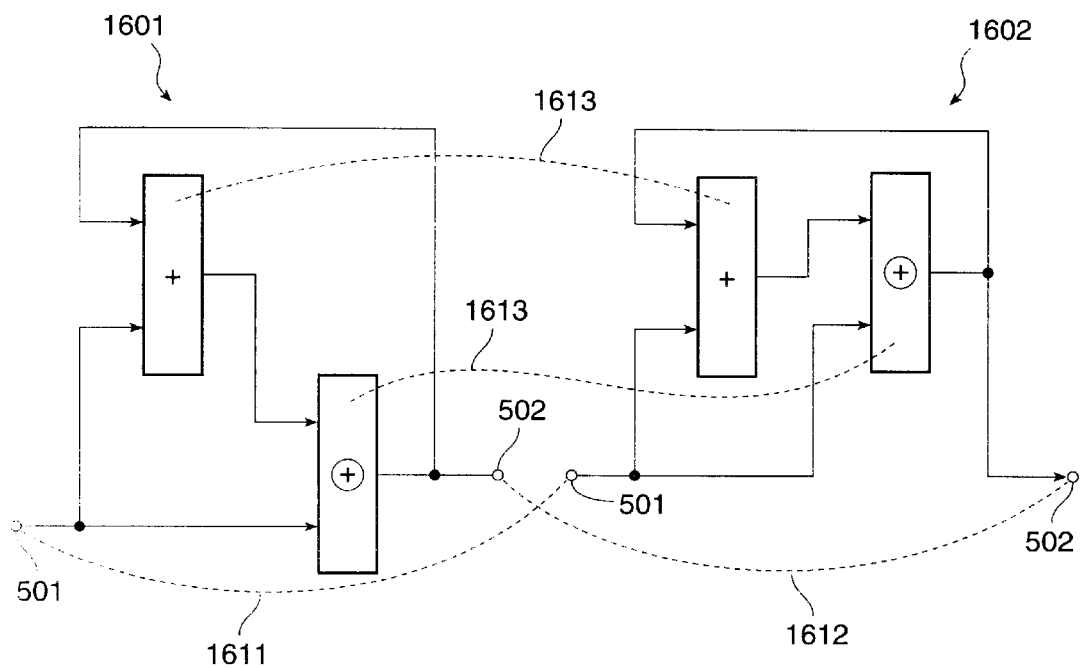
FIG. 16 shows a pair of circuits compared for structural equivalence.

FIG. 16 shows a pair of circuits compared for structural equivalence.

Although it is clear to a human observer that two circuits 1601 and 1602 are structurally equivalent, the viewpoint of a human observer is not readily available to a computer processor.

At a step 1341, the circuit design tool 110 matches the input bits 501 and output bits 502 for the first and second structural descriptions 180. Association 1611 shows matching input bits 501; association 1612 shows matching output bits 502.

At a step 1342, the circuit design tool 110 matches those elements coupled to already-matched elements; thus, after matching the output bits 502, the circuit design tool 110 matches those logic connections 602 coupled to the output bits 502. After matching logic connections 602 coupled to the output bits 502, the circuit design tool 110 matches logic blocks 601 coupled to those logic connections 602. Associations 1613 show matching elements.

The circuit design tool 110 recursively repeats this step 1342, repeatedly matching all elements coupled to already-matched elements, until all coupled elements have been matched or until it finds an unmatchable difference.

At a step 1343, the circuit design tool 110 determines if all elements of the first and second structural descriptions 180 have been matched. The first and second structural descriptions 180 are considered equivalent only if no elements remain unmatched, and if no unmatchable differences are found.

Unmatchable differences can arise in several ways, including the following:

(1) Attempting to match two logic blocks 601 which are of differing types and not equivalent.

(2) Attempting to match two logic blocks 601, one of which has already been matched, or both of which have already been matched but not to each other.

(3) Attempting to match two logic connections 602, one of which has already been matched, or both of which have already been matched but not to each other.

A feature of this aspect of the invention is that the circuit design tool 110 can verify that a component 152 it designs is equivalent to a selected component 152 which was designed by hand.

BIT-REVERSING SIGNAL FLOW

A fourth aspect of the invention provides a circuit design tool which includes a method for bit-reversing the signal flow in a component.

A prototype of each bit-reversed component 152 is built by a tool builder for the circuit design tool 110, and the functional description 170 and the structural description 180 of the prototype are used by the circuit design tool 110 at the time the netlist 160 is built.

Figure 17:
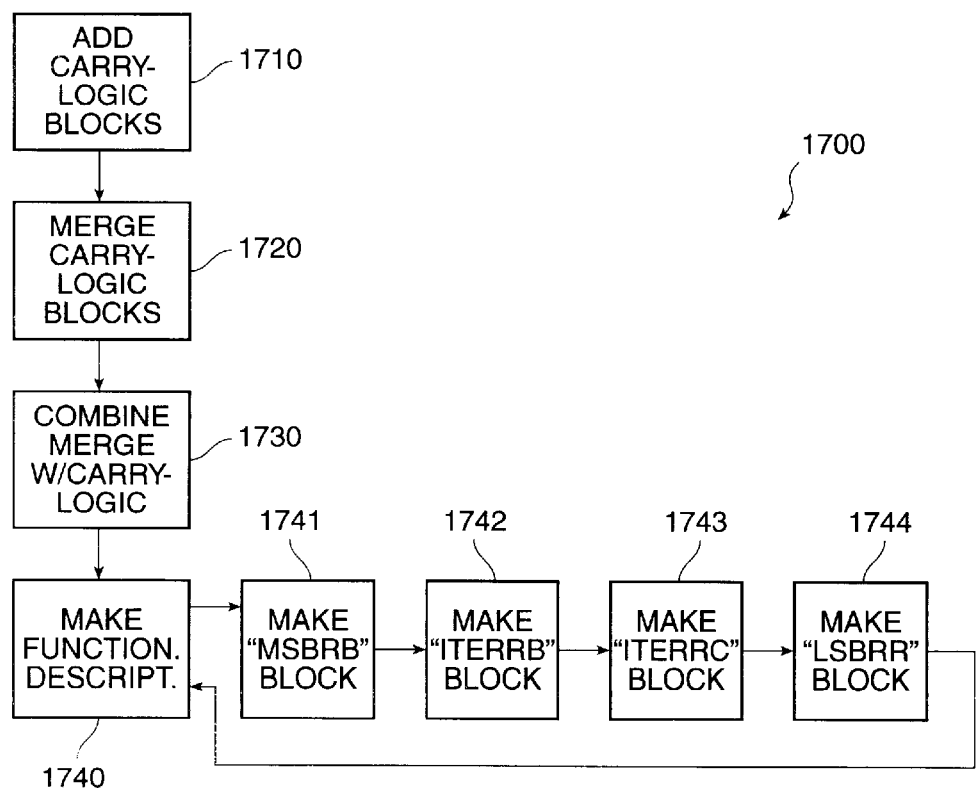
FIG. 17 shows a process flow diagram for a method for bit-reversing signal flow in a component.

FIG. 17 shows a process flow diagram for a method for bit-reversing signal flow in a component 152.

FIG. 19 shows a component 152 having a directional signal flow being transformed into a component 152 having a bit-reversed directional signal flow.

A method 1700 of bit-reversing signal flow in a component 152 operates on the functional description 170 and the structural description 180 for the component 152. For example, the method 1700 may operate on a least significant bit (LSB)-first comparator to produce a most significant bit (MSB)-first comparator.

A component 152 comprises a set of bitslices 1900, each of which operates, in general, on one input bit 501 and produces one output bit 502. A set of carry signals 1910 are each coupled between a selected bitslice 1900 x and a next selected bitslice 1900 x+1. In general, it is desired to ripple the carry signals 1910 from the least significant bit to the most significant bit, but data for the most significant bit is available before data for the least significant bit. This is shown in FIG. 19, panel A.

Although each one of the bitslices 1900 comprises an arbitrary logic block 601, the carry signal 1910 output by the bitslice 1900 is responsive to the carry signal 1910 input by the bitslice 1900 in one of four defined ways shown in table 19-1.

TABLE 19-1

| Short Title | Meaning |
| --- | --- |
| Kill (K) | the carry output value is low (0) independent of the carry input value |
| Generate (G) | the carry output value is high (1) independent of the carry input value |
| Propagate (P) | the carry output value is the same as the carry input value |
| Toggle (T) | the carry output value is the inverse of the carry input value |

These four signals, Kill, Generate, Propagate, or Toggle, may be assigned a two-bit encoding. An encoding for carry look-ahead architectures is Kill=11, Propagate=01, Generate=10, and Toggle=00. An encoding for carry select architectures is Kill=00, Propagate=01, Generate=11, and Toggle=10. An encoding for use in a preferred embodiment is Kill=01, Propagate=x0 (where x=a "don't care" value), Generate=11, and Toggle is unused.

The method 1700 comprises a set of steps 1710 through 1740 inclusive, and is performed by the circuit design tool 110.

At a step 1710, the circuit design tool 110 replaces each of the bitslices 1900 with a first carry-logic block 1920 and a second logic block 601 representing the original abstract behavior of the bitslice 1900 (adjusted for the carry-logic block 1920).

This requires decomposition of the truth table for each logic block 601 "MSB" (most significant bit), logic block 601 "Iter" (intermediate bit), or logic block 601 "LSB" (least significant bit). After decomposition of the truth table, encodings are assigned for the four signals Kill, Generate, Propagate, or Toggle (for data outputs) or for three of the signals Kill, Generate, or Propagate (for carry outputs). After encodings are assigned, truth tables are generated for elements Fa (which performs the operation of the logic block 601), Fb (which selects output for the carry bit), or Fc (which selects output for the data bit).

Figure 18:
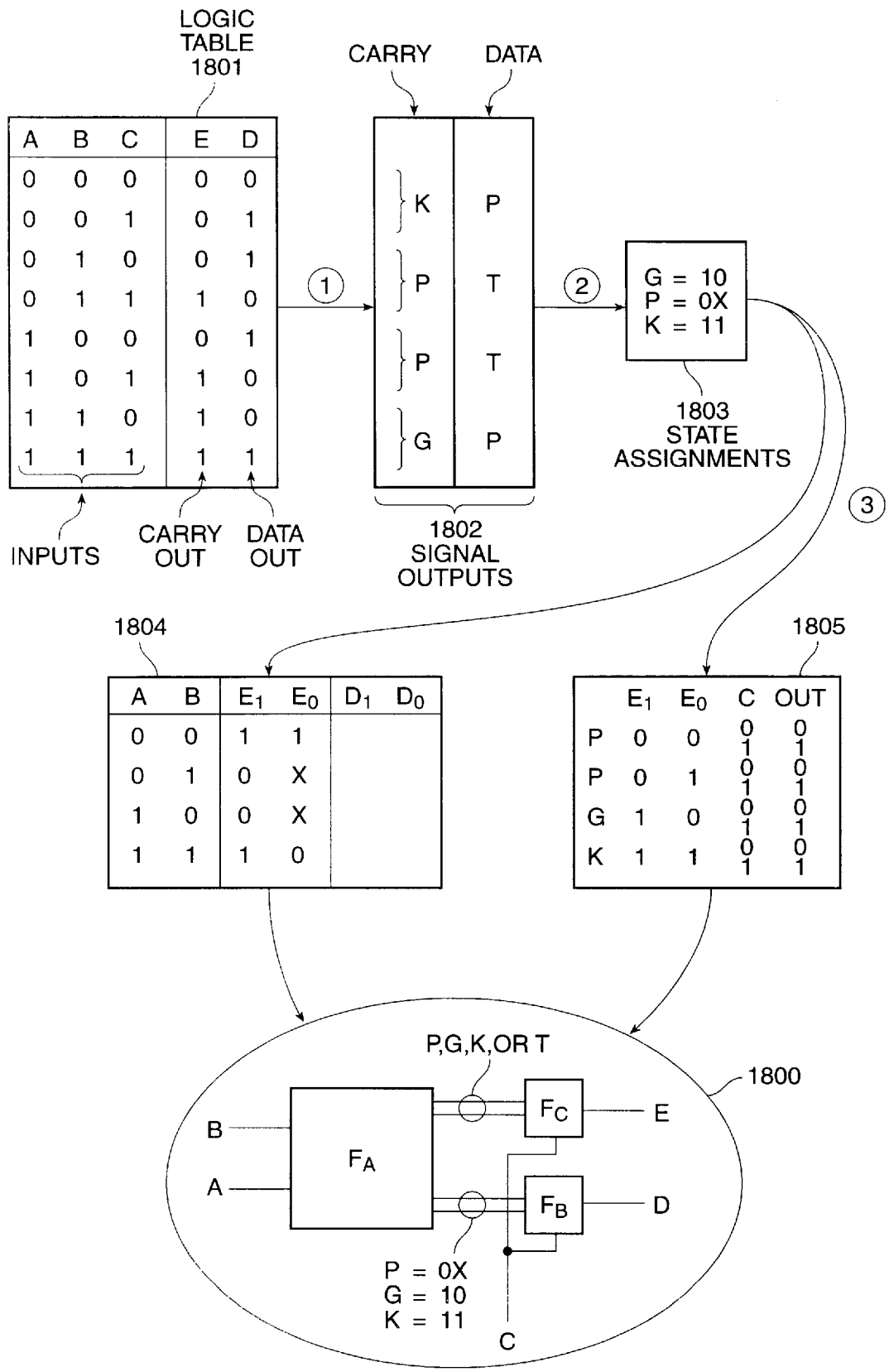
FIG. 18 shows operation of the method for bit-reversing signal flow to decompose logic blocks.
Figure 19A:
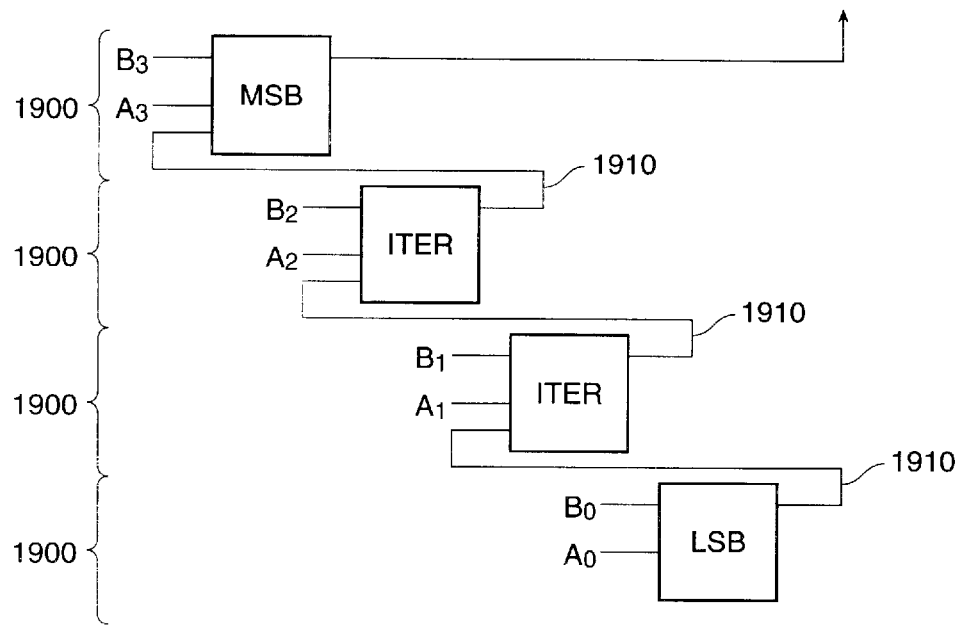
FIG. 19 shows a component having a directional signal flow being transformed into a component having a bit-reversed directional signal flow.
Figure 19B:
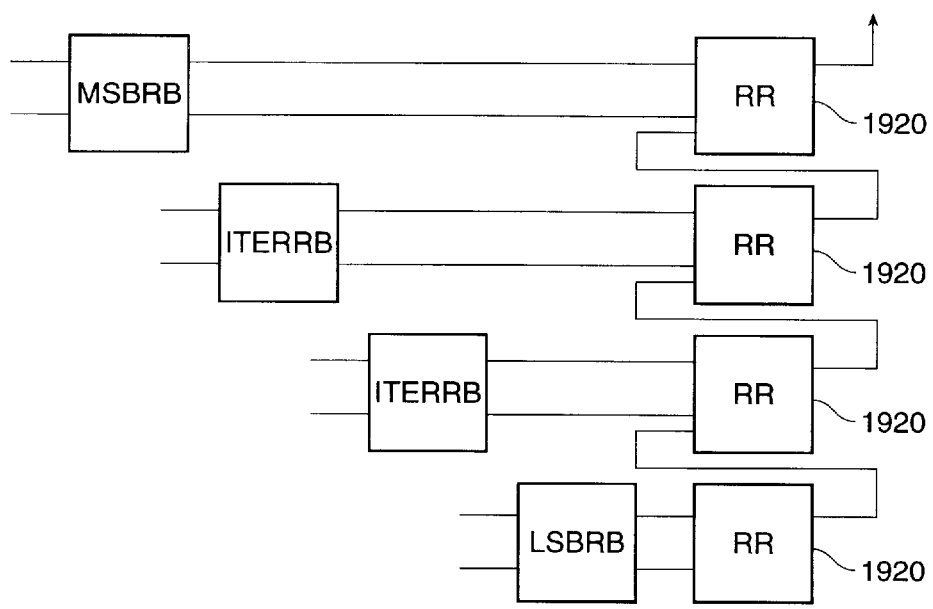
Figure 19C:
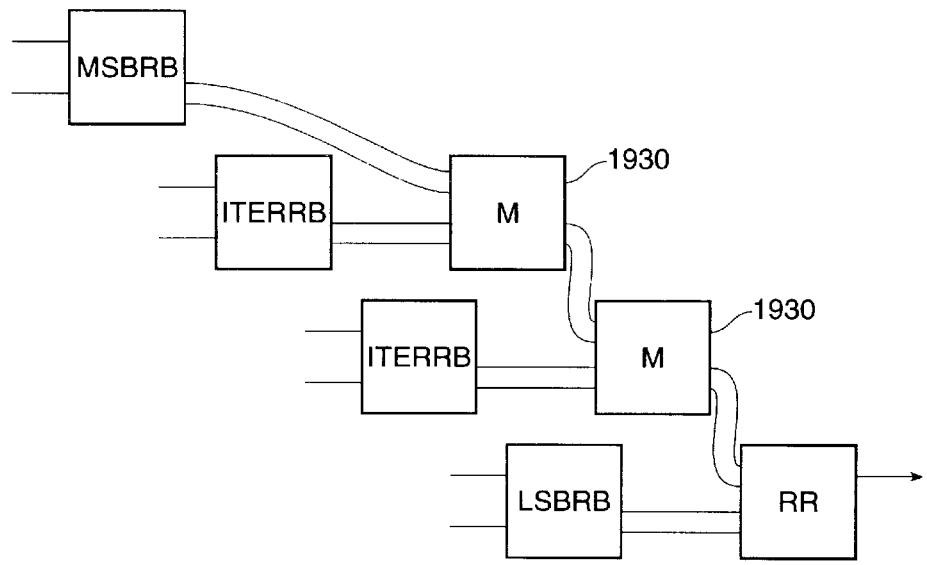
Figure 19D:
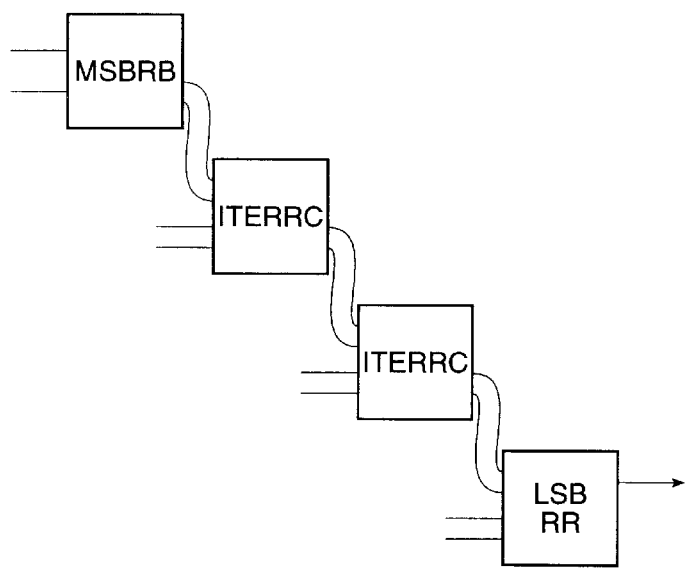

FIG. 18 shows operation of the method 1700 for bit-reversing signal flow to decompose logic blocks 601.

A logic table F 1801 for the component 152 is examined for signal outputs 1802. The signal outputs 1802 are given state assignments 1803. The state assignments 1803 are used to determine a logic table Fa 1804 and a logic table Fb 1805, for use in a combination of elements 1800 which are equivalent to the original component 152.

The logic table F 1801, logic table Fa 1804, and logic table Fb 1805, can be combined with other logic tables. Combining logic tables is known in the art of mathematical logic.

Thus, an "MSB" logic block 601 is replaced with an "MsbRB" logic block 601 and an "RR" carry-logic block 1920, an "Iter" logic block 601 is replaced with an "IterRB" logic block 601 and an "RR" carry-logic block 1920, and an "LSB" logic block 601 is replaced with an "LsbRB" logic block 601 and an "RR" carry-logic block 1920. FIG. 19, panel B, shows a result of the step 1710.

At a step 1720, the circuit design tool 110 replaces carry-logic blocks 1920 coupled in series with a merge-carry block 1930. The merge-carry block 1930 combines the operation of two carry-logic blocks 1920, as shown in table 19-2. Thus, a set of "RR" carry-logic blocks 1920 in parallel are replaced with a set of "M" merge-carry blocks 1930 in series with a single "RR" carry-logic block 1920. FIG. 19, panel C, shows a result of the step 1720.

TABLE 19-2

| Carry-Logic #1 | Carry-Logic #2 | Merged Carry-Logic |
| --- | --- | --- |
| Kill | Any | Kill |
| Generate | Any | Generate |
| Propagate | Kill | Kill |
| Propagate | Generate | Generate |
| Propagate | Propagate | Propagate |
| Propagate | Toggle | Toggle |
| Toggle | Kill | Generate |
| Toggle | Generate | Kill |
| Toggle | Propagate | Toggle |
| Toggle | Toggle | Propagate |

At a step 1730, the circuit design tool 110 logically combines, to create a combined logical truth table, the "IterRB" logic block 601 with the "M" merge-carry block 1930 to form an "IterRC" logic block 601, and combines the "LsbRB" logic block 601 with the "M" merge-carry block 1930 to form an "LsbRR" logic block 601. FIG. 19, panel D, shows a result of the step 1730.

The result in FIG. 19, panel D, provides a structural description 180 for use with the method 100.

At a step 1740, the circuit design tool 110 constructs the functional descriptions 170 for the "MsbRB" logic block 601, the "IterRB" logic block 601, "IterRC" logic block 601, and the "LsbRR" logic block 601. To perform this step 440, the circuit design tool 110 performs the steps 1741 through 1744 inclusive.

Figure 20:
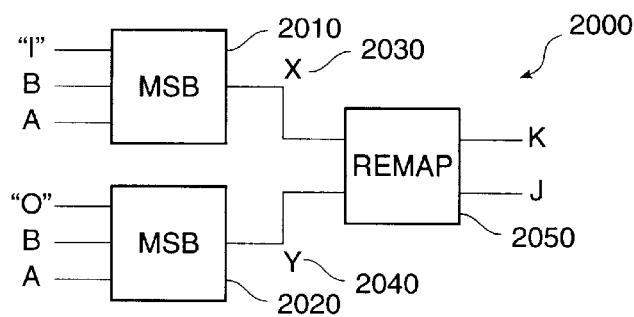
FIG. 20 shows a diagram for construction of the functional description for a logic block.
Figure 21A:
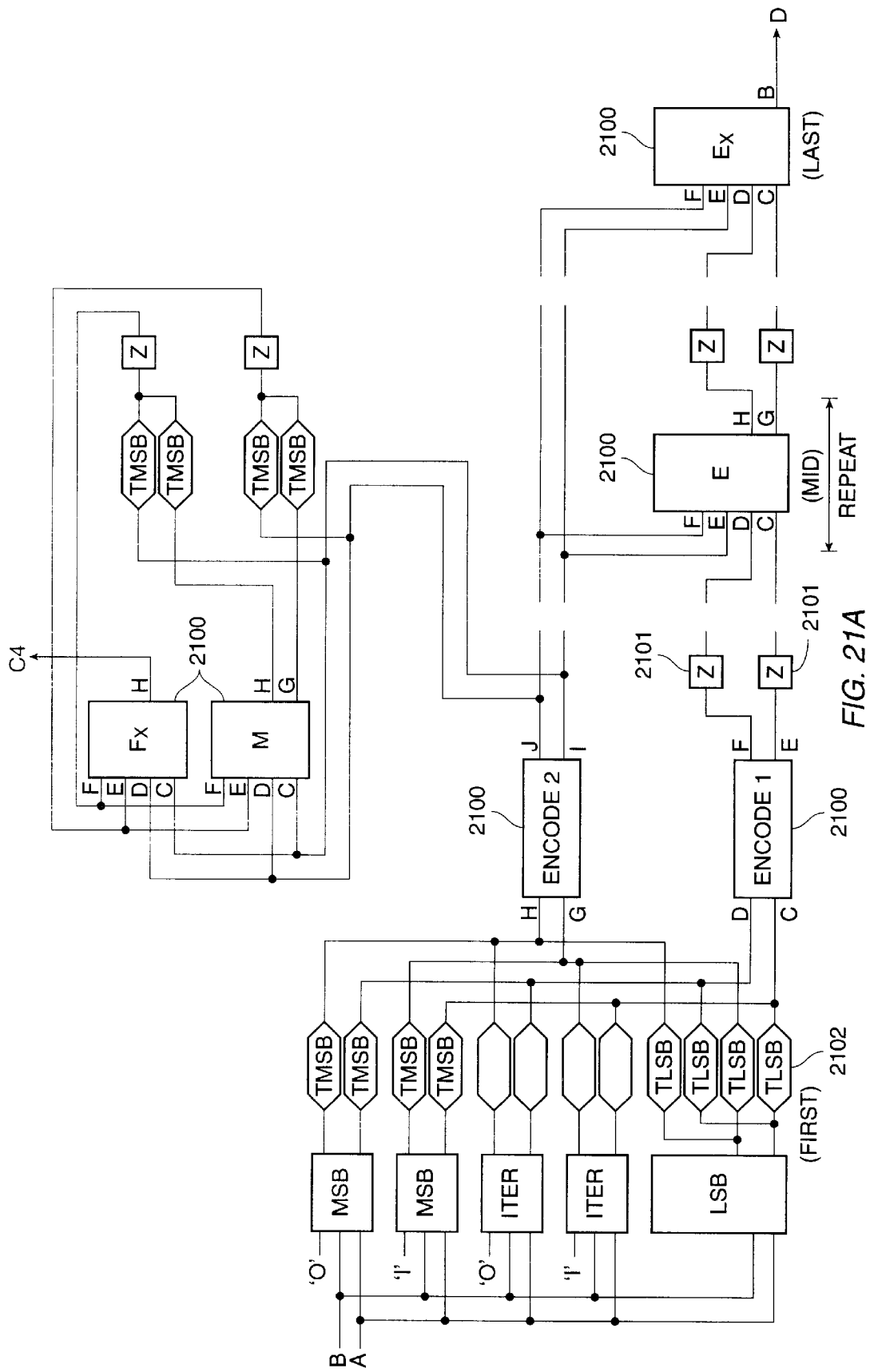
FIG. 21 (panels A, B, C, D, and E) shows construction of a for a bit-reversed arithmetic component 152.
Figure 21B:
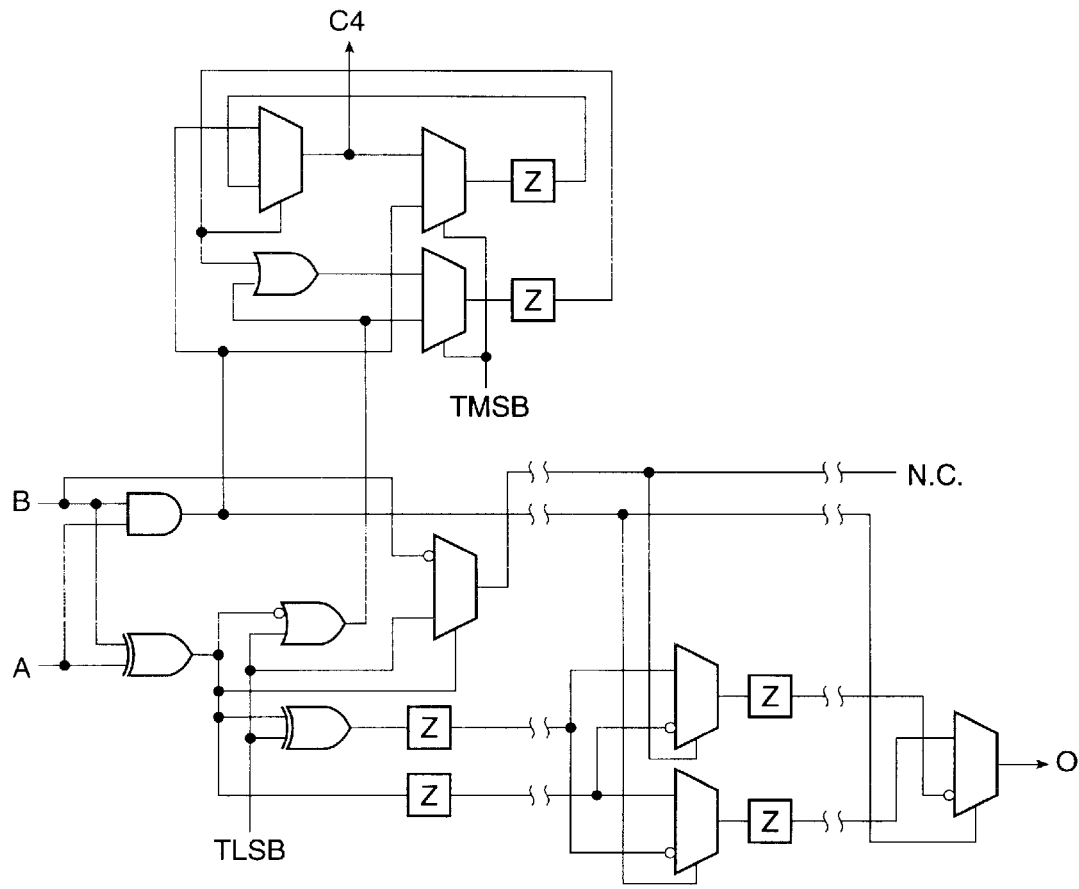
Figure 21D:
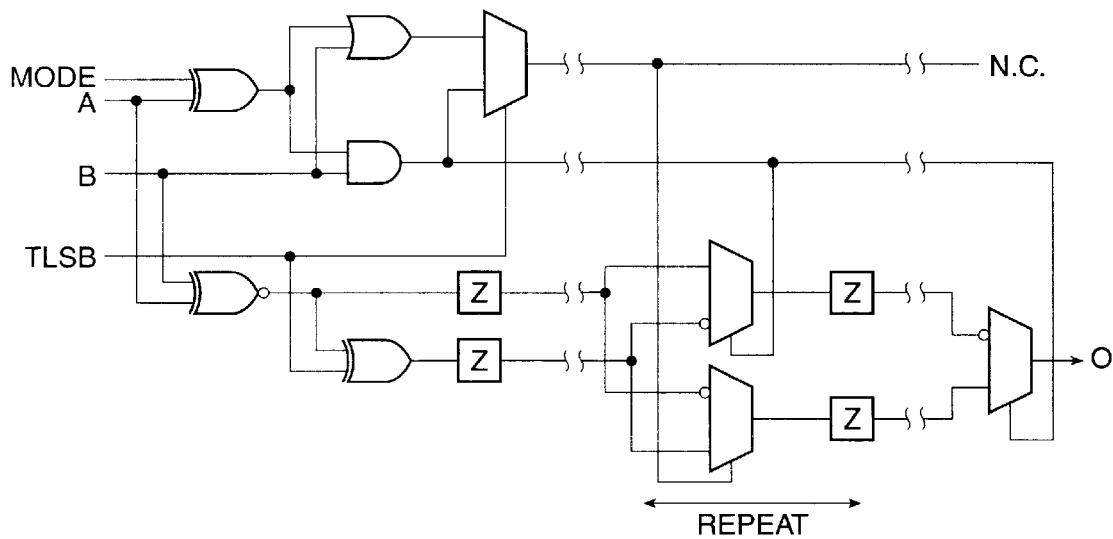
Figure 21C:
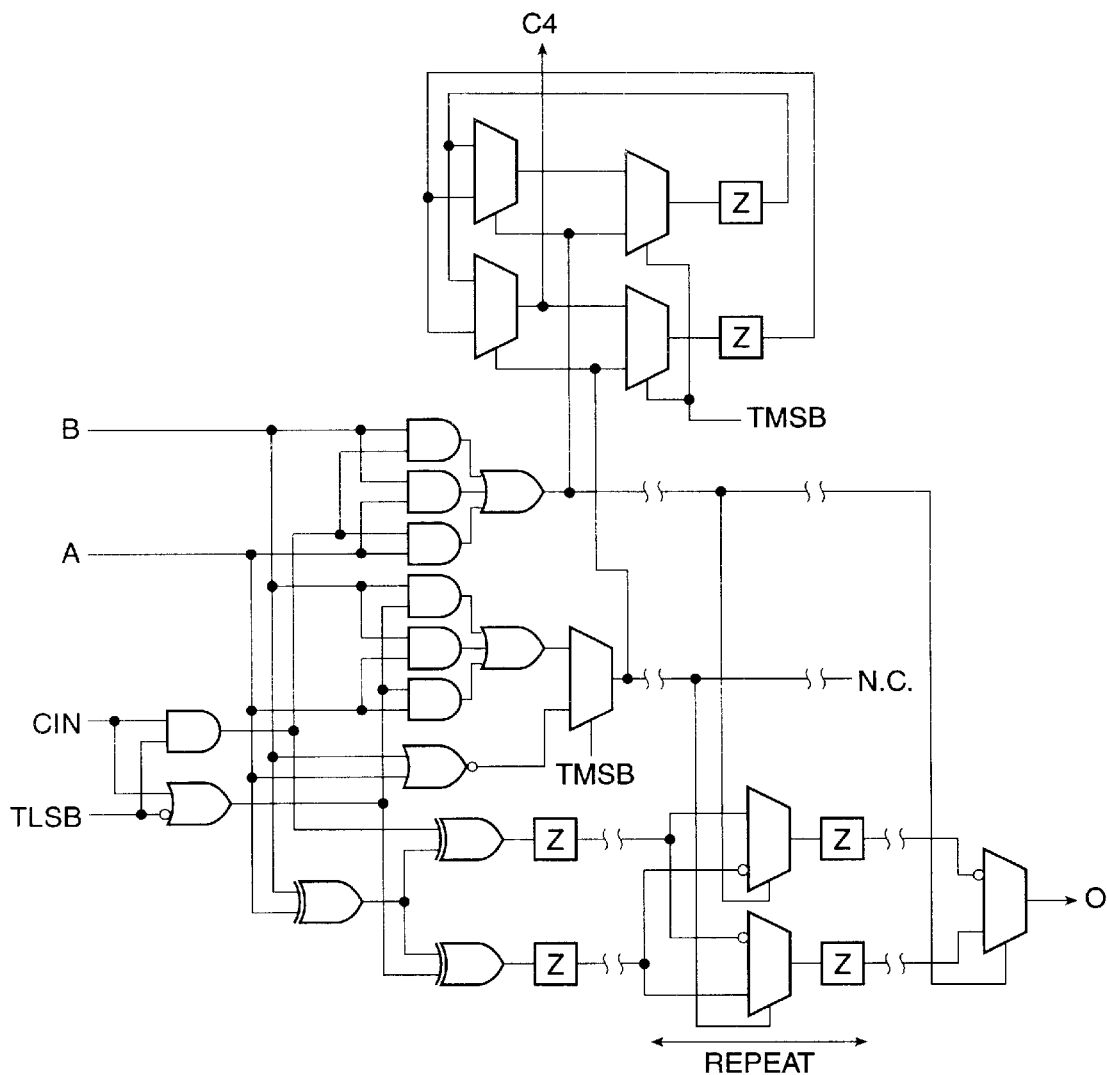
Figure 21E:
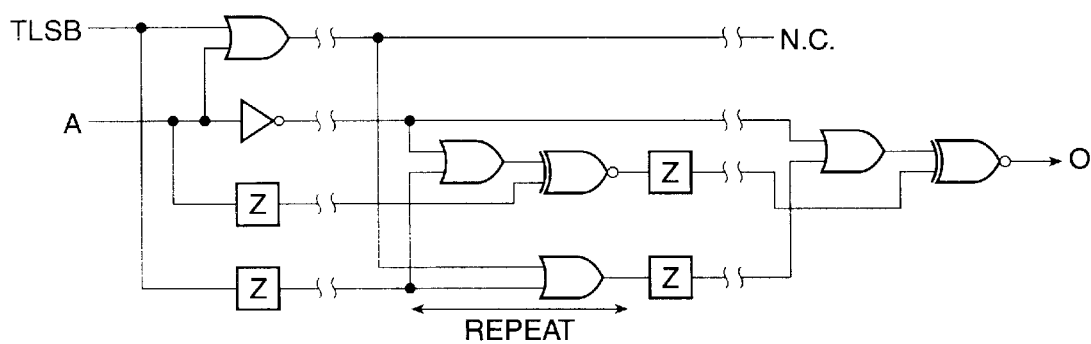
Figure 22A:
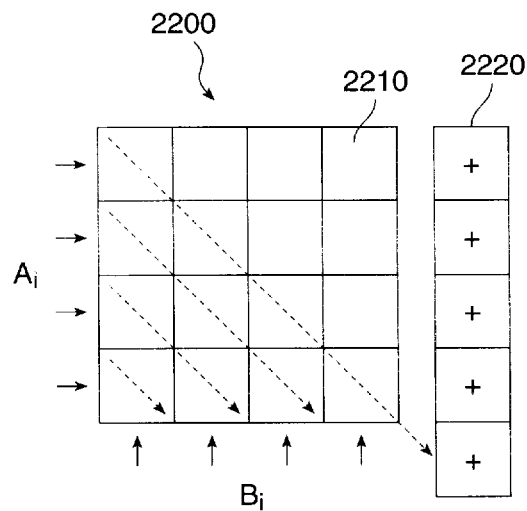
FIG. 22 (panels A, B, C, D, E, and F) shows construction of an array multiplier component 152.
Figure 22B:
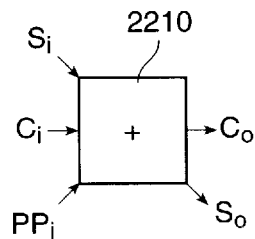
Figure 22C:
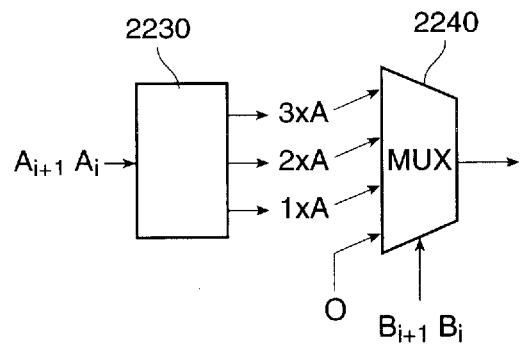
Figure 22D:
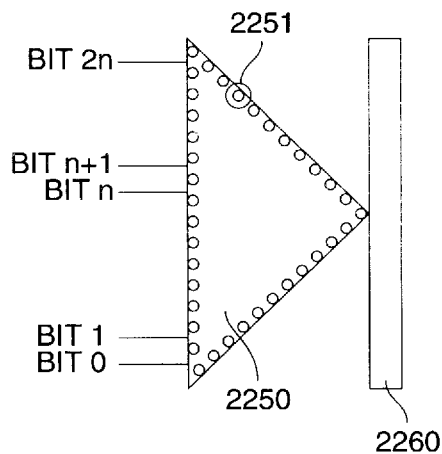
Figure 22E:
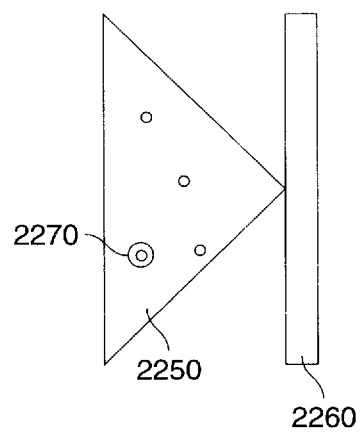
Figure 22F:
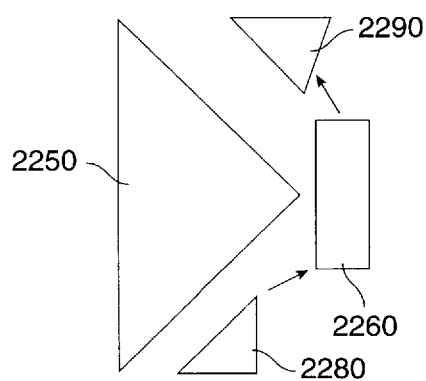

FIG. 20 shows a diagram for construction of the functional description 170 for a logic block 601.

At a step 1741, the circuit design tool 110 constructs the functional description 170 for the "MsbRB" logic block 601.

The circuit design tool 110 constructs a circuit 2000 having a first copy 2010 and a second copy 2020 of the "MSB" logic block 601 from the original function description 170 of the component 152. FIG. 20 shows the circuit 2000. The first copy 2010 of the "MSB" logic block 601 is coupled to a carry input value which is set to be "0", and produces a first output 2030 X; the second copy 2020 of the "MSB" logic block 601 is coupled to a carry input value which is set to be "1", and produces a second output 2040 Y. The first output 2030 X and the second output 2040 Y are coupled to a remapping block 2050, which produces outputs J and K compatible with the "RR" carry-logic block 1920 and the "M" merge-carry block 1930.

Table 20-1 shows one possible mapping between X, Y and the four possible carry value operations.

TABLE 20-1

| X | Y | Meaning |
|---|---|---------|
| 0 | 0 | Kill |
| 0 | 1 | Toggle |
| 1 | 0 | Propagate |
| 1 | 1 | Generate |

Table 20-2 shows one possible mapping between J, K and the four possible carry value operations.

TABLE 20-2

| J | K | Meaning |
|---|---|---------|
| 0 | 0 | Kill |
| 0 | 1 | Generate |
| 1 | 0 | Propagate |
| 1 | 1 | Toggle |

The circuit design tool 110 constructs the logic equations 503 for J and K, responsive to the inputs for the "MSB" logic block 601 and the logic equation 503 for the "MSB" logic block 601.

Tables 20-3 and 20-4 show logic equations for J and K, responsive to X and Y and the logic equation 503 for the "MSB" logic block 601.

TABLE 20-3

| Meaning | X | Y |
|---------|---|---|
| Generate | g0 | g1 |
| Kill | k0 | k1 |
| Propagate | p0 | p1 |
| Toggle | t0 | t1 |

In table 20-3, g0 and g1 indicate the bits assigned to the "Generate" signal, k0 and k1 indicate the bits assigned to the "Kill" signal, p0 and p1 indicate the bits assigned to the "Propagate" signal, and t0 and t1 indicate the bits assigned to the "Toggle" signal.

TABLE 20-4

$J = g0\ X\ Y + k0\ (\neg X)\ (\neg Y) + p0\ X\ (\neg Y) + t0\ (\neg X)\ Y$ $K = g1\ X\ Y + k1\ (\neg X)\ (\neg Y) + p1\ X\ (\neg Y) + t1\ (\neg X)\ Y$ Table 20-5 shows production of logic equations 503 for J, K, responsive to the inputs for the "MSB" logic block 601.

TABLE 20-5

| X | = | $A(\neg B) + A(1) + 1(\neg B)$ | J | = | $g0XY + k0(\neg X)(\neg Y) +$ |
|---|---|---|---|---|---|
|   | = | $A + (\neg B)$ |   |   | $p0X(\neg Y) + t0(\neg X)Y$ |
|   |   |   |   | = | $0\ XY + 0\ (\neg X)(\neg Y) + 1$ |
|   |   |   |   |   | $X(\neg Y) + 1\ (\neg X)Y$ |
|   |   |   |   | = | $X(\neg Y) + (\neg X)Y$ |
|   |   |   |   | = | $(A + (\neg B))(\neg(A\ (\neg B))) +$ |
|   |   |   |   |   | $(\neg(A + (\neg B)))(A\ (\neg B))$ |
|   |   |   |   | = | $AB + (\neg A)(\neg B)$ |

TABLE 20-5-continued

| Y | = | $A(\neg B) + A(0) + 0(\neg B)$ | K | = | $g1XY + k1(\neg X)(\neg Y) +$ |
|---|---|---|---|---|---|
|   | = | $A(\neg B)$ |   |   | $p1X(\neg Y) + t1(\neg X)Y$ |
|   |   |   |   | = | $1\ XY + 0\ (\neg X)(\neg Y) + 0$ |
|   |   |   |   |   | $X(\neg Y) + 1\ (\neg X)Y$ |
|   |   |   |   | = | $XY + (\neg X)Y$ |
|   |   |   |   | = | $Y$ |
|   |   |   |   | = | $A(\neg B)$ |

At a step 1742, the circuit design tool 110 constructs the functional description 170 for the "IterRB" logic block 601, in like manner as the step 441 for the "MsbRB" logic block 601.

At a step 1743, the circuit design tool 110 constructs the functional description 170 for the "IterRC" logic block 601. The "IterRC" logic block 601 is simply the "IterRB" logic block 601, concatenated with the "M" merge-carry block 1930.

At a step 1744, the circuit design tool 110 constructs the functional description 170 for the "LsbRR" logic block 601. The "LsbRR" logic block 601 is simply the "LSB" logic block 601 from the original function description 170 of the component 152, catenated with the "RR" carry-logic block 1920.

BIT-REVERSED ARITHMETIC COMPONENTS

A fifth aspect of the invention provides a circuit design tool which includes a method for performing arithmetic operations backwards from a natural order.

FIG. 21 (panels A, B, C, D, and E) shows construction of a for a bit-reversed arithmetic component 152.

FIG. 21, panel A, shows a structural description 180 for a bit-reversed arithmetic component 152.

A bit-reversed arithmetic component 152 is similar to a result of the method 1700 of bit-reversing signal flow in a component 152. However, many arithmetic components 152 (including adders and subtractors) have an inherent data flow direction in which carry signals travel, which is from the least significant bit toward the most significant bit. The bit-reversed arithmetic component 152 comprises an MSB-first serial arithmetic component 152. For example, an adder component 152 may be transformed using the method 100 to produce an MSB-first serial adder component 152.

The bit-reversed arithmetic component 152 comprises logic blocks 601 for a most significant bit (MSB), a set of intermediate bits (ITER), and a least significant bit (LSB), similar to the bit-reversed component 152 described with regard to FIG. 19. These logic blocks 601 are available for substitution using logic equations 503 for the designer's choice of arithmetic operation.

The bit-reversed arithmetic component 152 comprises logic blocks 601 comprising delay gates 2101 and time gates 2102. The LSB, ITER, and MSB logic blocks 601 are coupled to the time gates 2102.

The bit-reversed arithmetic component 152 comprises a set of state-encoding blocks 2100.

A first state-encoding block 2100 "encode 1" receives a state encoding for data signals and transforms that state encoding for a next bit stage. The "encode 1" block 2100 comprises two inputs C and D, and two outputs E and F, which encode the propagation signals for data bits, in similar manner as described with regard to FIG. 17. The particular encoding for the "encode 1" block 2100 is responsive to the particular arithmetic function to be performed by the bit-reversed arithmetic component 152.

In a preferred embodiment, the "encode 1" block 210 may use an identity encoding in which E=C and F=D. However, in alternative embodiments, other encodings may be used for the "encode 1" block 210 if such other encodings would result in better netlists 160 after logic optimization. Accordingly, in a preferred embodiment, the component generator engine 230 builds multiple versions of the bit-reversed arithmetic component 152 using each of the twelve possible different encodings for the "encode 1" block 210.

A second state-encoding block 2100 "encode 2" receives a state encoding for carry signals and transforms that state encoding for a next bit stage. The "encode 2" block 2100 comprises two inputs G and H, and two outputs I and J, which encode the propagation signals for carry bits, in similar manner as described with regard to FIG. 17. The particular encoding the "encode 2" block 2100 is responsive to the particular arithmetic function to be performed by the bit-reversed arithmetic component 152.

Similar to the "encode 1" block 2100, in a preferred embodiment, the "encode 2" block 210 may use an identity encoding in which I=G and J=H. However, in alternative embodiments, other encodings may be used for the "encode 2" block 210 if such other encodings would result in better netlists 160 after logic optimization. Accordingly, in a preferred embodiment, the component generator engine 230 builds multiple versions of the bit-reversed arithmetic component 152 using each of the twelve possible different encodings for the "encode 2" block 210.

Table 21-1 shows an encoding for the "E" logic block 210.

TABLE 21-1

|        | EF = 00 | EF = 01 | EF = 10 | EF = 11 |
|--------|---------|---------|---------|---------|
| CD = 10 | 01 | 01 | 01 | 01 |
| CD = 11 | 11 | 01 | 00 | 10 |
| CD = 01 | 10 | 10 | 10 | 10 |
| CD = 00 | 00 | 10 | 11 | 01 |

Table 21-2 shows an encoding for the "Ex" logic block 210. Each entry shows a first bit for the encoding for the carry bit and a second bit for the encoding for the data bit, where "x" is a "don't care" value.

TABLE 21-2

|        | EF = 00 | EF = 01 | EF = 10 | EF = 11 |
|--------|---------|---------|---------|---------|
| CD = 10 | 11 | 11 | 11 | 11 |
| CD = 11 | x1 | 10 | xx | 0x |
| CD = 01 | 00 | 00 | 00 | 00 |
| CD = 00 | x0 | 01 | xx | 1x |

The bit-reversed arithmetic component 152 also comprises additional state-encoding blocks 2100 "M", and "Rx" similar to those described with regard to FIG. 17.

FIG. 21, panel B, shows an unsigned adder with a carry input but no carry output.

FIG. 21. panel C, shows a signed adder with both a carry input and a carry output. FIG. 21, panel D, shows a programmable add/subtract block with no carry input or carry output, with a "MODE" signal to control whether the circuit adds or subtracts.

FIG. 21, panel E, shows a signed negation circuit, with no carry input or output.

MULTIPLIER ARCHITECTURE

A sixth aspect of the invention provides a circuit design tool which includes an architecture for a multiplier which is faster and more compact than known multipliers.

FIG. 22 (panels A, B, C, D, E, and F) shows construction of an array multiplier component 152.

An array multiplier component 152 comprises two sets of input bits 501 $A_i$ and $B_j$, representing two multiplicands, and a set of output bits 502 $O_j$, representing a product. FIG. 22, panel A, shows a conventional design, in which input bits 501 $A_i$ are coupled to rows of a matrix 2200 of cells 2210, input bits 501 $B_j$ are coupled to columns of the matrix 2200, and partial products are summed along diagonals of the matrix 2200. The first column differ from other columns in that it does not comprise the $C_i$ or $S_i$ inputs, and therefore has simpler cells than other columns; the second column differ from other columns in that it does not comprise the $C_i$ inputs, and therefore has simpler cells than other columns (except the first column). An adder 2220 is coupled to the partial products and provides the output bits 502 $O_j$.

FIG. 22, panel B, shows the form of the cells 2210. Each cell 2210 comprises an adder 2230, in which a partial product $A_iB_j$, an input sum bit $S_i$ from along the diagonal, and an input carry bit $C_i$ from a next-less significant diagonal, are added to produce an output sum bit $S_o$ for along the diagonal and an output carry bit $C_o$ for a next-more significant diagonal.

The multiplier component 152 is transformed by pairing input bits 501 $A_iA_{i+1}$ and pairing input bits 501 $B_jB_{j+1}$ so that the matrix 2200 comprises one-half as many rows and one-half as many columns.

FIG. 22, panel C shows a transformed cell 2210. Each cell 2210 is transformed so as to generate a 2-bit by 2-bit partial product as follows: a pair of input bits 501 $A_iA_{i+1}$ are coupled to a mini-multiplier 2230, which generates a set of miniproducts 1 times, 2 times, and 3 times, the input bits 501 $A_iA_{i+1}$. These mini-products are coupled to a multiplexer 2240, which selects one of the mini-products under control of a pair of input bits 501 $B_jB_{j+1}$ (a fourth input to the multiplexer 2240 is a constant logical zero, representing the product of 0 times the input bits 501), to produce a partial product $P_{ij}$. Each cell 2210 is further transformed so as to add multibit partial products $P_{ij}$.

The 1 times and 2 times mini-products are easily computed. The 1 times mini-product simply equals the input bits 501; the 2 times mini-product simply equals the input bits 501 shifted one bit left. The 3 times mini-product is computed by adding the 1 times mini-product to the 2 times mini-product, but this computation is made only once for all columns. There are of course many ways to compute each of the mini-products which would be applicable to the multiplier in alternative embodiments.

FIG. 22, panel D, shows a further transformation of the multiplier component 152. The multiplier component 152 is further transformed into a Wallace tree 2250, in which each of the diagonals of the matrix 2230 is coupled to a set of full adders 2251. The Wallace tree 2250 is coupled to a set of terminating adders 2260 which produce the final product. Wallace trees are known in the art of circuit design.

FIG. 22, panel E, shows a further transformation of the multiplier component 152. The multiplier component 152 is further transformed by adding a set of "Dadda nodes" 2270; each Dadda node 2270 uses a half adder rather than the full adder which would otherwise be used. The multiplier component 152 is further transformed by tracing back a critical path from the set of terminating adders 2260 to one of the Dadda nodes 2270. When the critical path comprises one of the Dadda nodes 2270, that Dadda node 2270 is eliminated by replacing its half adder with a full adder 2251. This transformation is repeated until the critical path no longer comprises one of the Dadda nodes 2270 (whether because all the Dadda nodes 2270 have been eliminated, or because the critical path then avoids all remaining Dadda nodes 2270).

Dadda nodes 2270 are known in the art of circuit design; they are described in the following articles:

- L. Dadda, "Some schemes for parallel multipliers," Alta Frequenza, vol. 34, pp. 349–356 (Mar. 1965);
- L. Dadda, "On parallel digital multipliers," Alta Frequenza, vol. 45, no. 10, pp. 574–580 (1976);
- L. Dadda, "Composite parallel counters," IEEE Trans. Comput., vol. C-29, no. 10, pp. 942–946 (Oct. 1980).

FIG. 22, panel F, shows a further transformation of the multiplier component 152. The multiplier component 152 is further transformed by replacing low-order ones of the terminating adders 2260 with a ripple-carry adder 2280, and by replacing high-order ones of the terminating adders 2260 with a carry-select adder 2290.

In a preferred embodiment, the various transformations for the multiplier component 152 described herein are each made independently or in combination. The component generator engine 230 generates a plurality of different multiplier components 152, each with a different combined set of transformations, so as to produce a plurality of different multiplier components 152. As described herein, the carburetor element 220 selects one of these different multiplier components 152 for the one or more netlists 160 to be presented to the tool user 130.

In a preferred embodiment, a 16-bit by 16-bit multiplier component 152 built using LSI500K fabrication technology in which an XOR gate has a gate delay of about 0.4 nanoseconds, has a delay across the entire component 152 of about 8 nanoseconds.

TRANSLATING LOGIC EQUATION INTO LOGIC GATES

A seventh aspect of the invention provides a circuit design tool which includes a method for translating a logic equation into a netlist of connected logic gates.

Figure 23:
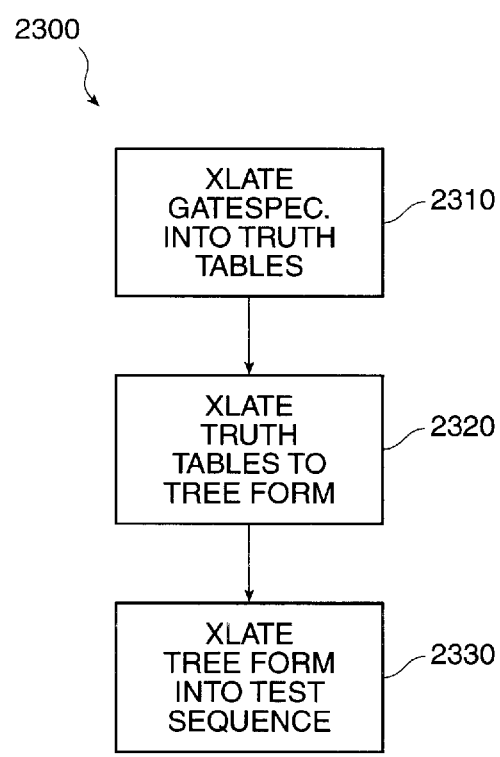
FIG. 23 shows a process flow diagram for a method for translating a logic equation into a netlist of connected logic gates.

FIG. 23 shows a process flow diagram for a method for translating a logic equation into a netlist of connected logic gates.

The method 2300 comprises a set of steps 2310 through 2330 inclusive, and is performed by the circuit design tool 110.

At a step 2310, the circuit design tool 110 translates a set of logic gate specifications into a set of permuted truth tables for those logic gates.

At a step 2320, the circuit design tool 110 translates the set of permuted truth tables into a tree form.

At a step 2330, the circuit design tool 110 translates the tree form into a sequence of tests for recognizing a function performed by one of those logic gates in a specification of the logic equation.

In a preferred embodiment, the method 2300 is used to generate a database of functional components for use by the circuit design tool.

Alternative Embodiments

Although preferred embodiments are disclosed herein, many variations are possible which remain within the concept, scope, and spirit of the invention, and these variations would become clear to those skilled in the art after perusal of this application.

I claim:

1. A method for the operation of a circuit design tool to design a multiplier circuit, comprising the steps of forming a netlist for a Wallace tree, whereby said Wallace tree comprises a tail of adders;

tracing a critical path for said netlist to a Dadda node in said Wallace tree and eliminating said Dadda node by replacing said Dadda node with a full-adder;

placing a half-adder at an initial part of said Wallace tree and removing an adder in said tail; and repeating said steps of tracing and placing until a selected condition is reached.

2. A method for the operation of a circuit design tool to design a multiplier circuit as in claim 1, wherein said selected condition is that said tail is minimized.

3. A method for the operation of a circuit design tool to design a multiplier circuit as in claim 1, comprising the steps of forming a netlist for a final adder coupled to said Wallace tree; and forming a netlist for a ripple carry adder at a low end of said Wallace tree and removing a portion of said final adder.

4. A method for the operation of a circuit design tool to design a multiplier circuit as in claim 1, comprising the steps of forming a netlist for a final adder coupled to said Wallace tree; and forming a netlist for a carry select adder at a high end of said Wallace tree and removing a portion of said final adder.

5. A method for the operation of a circuit design tool to design a multiplier circuit as in claim 1, comprising the steps of defining a matrix of partial products;

recoding pairs of said partial products so as to select each said partial product from a set of more than two possible outputs;

wherein said step of forming a netlist for a Wallace tree is responsive to said step of recoding.

* * * * *

UNITED STATES PATENT AND TRADEMARK OFFICE
CERTIFICATE OF CORRECTION

PATENT NO. : 5,841,674
DATED : November 24, 1998
INVENTOR(S) : David L. Johannsen It is certified that error appears in the above-identified patent and that said Letters Patent is hereby corrected as shown below:

On column 19, Table 12-1, line 2, please replace "⌐" with -- ¬ --. (both occur.)

On column 19, Table 12-1, line 3, please replace "⌐" with -- ¬ --.

On column 19, Table 12-1, line 5, please replace "⌐" with -- ¬ --.

On column 19, Table 12-1, line 6, please replace "⌐" with -- ¬ --.

On column 20, line 39, please replace "1343 with --1320--.

Signed and Sealed this

Eighth Day of February, 2000

Attest:

Q. TODD DICKINSON

Attesting Officer

Commissioner of Patents and Trademarks